(12) United States Patent
Zur et al.

(10) Patent No.: US 6,646,561 B1
(45) Date of Patent: Nov. 11, 2003

(54) METHOD AND DEVICE FOR IN-USE DETECTING LOW CRANKING STRENGTH OF A COMBUSTION ENGINE BATTERY DURING ENGINE STARTING

(75) Inventors: Amos Zur, Petach Tikva (IL); Offer Lapidot, Yavne (IL)

(73) Assignee: Battery Alert Ltd., Yavine (IL)

( * ) Notice: Subject to any disclaimer, the term of this patent is extended or adjusted under 35 U.S.C. 154(b) by 493 days.

(21) Appl. No.: 09/685,004

(22) Filed: Oct. 6, 2000

(51) Int. Cl.$^7$ .............................................. G08B 21/00
(52) U.S. Cl. ........................ 340/636; 340/659; 340/660; 340/661; 340/438; 340/455; 324/428; 324/433; 324/435
(58) Field of Search ................................. 340/636, 659, 340/660, 661, 438, 455; 324/428, 433, 435

(56) References Cited

U.S. PATENT DOCUMENTS

| | | |
|---|---|---|
| 3,997,888 A | 12/1976 | Kremer |
| 4,193,026 A * | 3/1980 | Finger et al. ............... 324/428 |
| 4,332,685 A | 6/1982 | Nowlin et al. |
| 4,423,378 A | 12/1983 | Marino et al. |
| 4,665,370 A | 5/1987 | Holland |
| 4,731,601 A | 3/1988 | Nowakowski et al. |
| 4,937,528 A | 6/1990 | Palanisamy |
| 4,943,777 A | 7/1990 | Nakamura et al. |
| 4,968,942 A | 11/1990 | Palanisamy |
| 5,281,919 A | 1/1994 | Palanisamy |
| 5,818,333 A | 10/1998 | Yaffe et al. |
| 6,091,325 A | 7/2000 | Zur et al. |

* cited by examiner

Primary Examiner—Julie Lieu

(57) ABSTRACT

A method and device for in-use detecting low cranking strength of a combustion engine battery during engine starting, based on integrating changes in battery voltage specifically during engine starting, from the time the electromechanical starting load is initially applied to the battery, and logically analyzing values of the integrated changes in battery voltage during engine starting, for determining whether or not there is an initial stage of developing low cranking strength of the battery. The invention features (a) sensing time varying voltage of the battery by a comparator, from initiation of, and during, engine starting, (b) comparing the time varying voltage of the battery to a constant reference DC voltage by the comparator, (c) integrating output signals of the comparator by an integrator, (d) determining and responding to the output signal of the integrator by a detector, and (e) determining and responding to the output signal of the detector by an alarm, for providing an in-use warning signal of the low cranking strength of the battery to an operator of the combustion engine, during or following engine starting, and, optionally, following engine turn-off. Optional inclusion of a counter reset sub-circuit enables resetting a counter which counts the number of occurrences the device detects changes in battery voltage corresponding to low cranking strength of the battery during engine starting.

80 Claims, 2 Drawing Sheets

METHOD AND DEVICE FOR IN-USE DETECTING LOW CRANKING STRENGTH OF A COMBUSTION ENGINE BATTERY DURING ENGINE STARTING

FIELD AND BACKGROUND OF THE INVENTION

The present invention relates to automatically monitoring the electrical condition of a combustion engine battery, and in particular, it relates to a method and device for in-use detecting low cranking strength of a combustion engine battery during engine starting. The present invention optionally includes steps and components for additionally controlling activation of an alarm, which provides in-use warning of the detected low cranking strength of the combustion engine battery, prior to engine turn-off, and optionally, following engine turn-off.

A battery is a principle component of the overall electrical system of any vehicle or device operable by a combustion engine, since so much depends upon its proper and reliable function. A combustion engine may be part of a vehicle, where a vehicle may be any mobile device powered by the combustion engine for carrying or transporting persons or objects of any kind, for example, an automobile, truck, farm vehicle such as a tractor or cotton combine, train, airplane, or boat. A combustion engine may also be part of a stand alone device, such as an electrical generator, cement mixer, or heavy duty power machinery.

The importance of a battery in a combustion engine, hereinafter, also referred to as a combustion engine battery, is most needed and appreciated at the time of starting the engine. Starting operation of a combustion engine involves activation of a starter mechanism. A starter mechanism of a combustion engine typically features a multitude of electrical and mechanical devices, mechanisms, and components, including the battery as an initial source of electrical power, a starter motor for electro-mechanically meshing with and initiating turning or cranking of the crankshaft of the engine motor, the engine motor crankshaft, a coil for generating high voltage required for continuous operation of the engine, and a myriad of related electrical and mechanical circuitry and connections among the various devices, mechanisms, and components, of the starter mechanism, as well as other devices, mechanisms, and components of the engine. Accordingly, the starter mechanism of a combustion engine operates in relation to an electrically and mechanically varying load during engine starting, hereinafter, also referred to as a 'starting load', where the overall starting load is due to operation of the above described combination of electrical and mechanical devices, mechanisms, and components required for starting the combustion engine.

Cranking strength of a combustion engine battery refers to the strength or ability of the battery to supply the necessary electrical energy, in the form of voltage and current, to the starter mechanism for effecting the initial cranking of the crankshaft of the engine motor until the motor is started, and therefore, until the crankshaft continuously operates by energy supplied to the motor by a generator or alternator, without depending only upon the battery. Cranking of the engine motor crankshaft during engine starting represents the most dominant or energy demanding component of the overall starting load. Clearly, as the cranking strength of the battery decreases, the strength or ability of the battery to 'properly' carry the overall starting load for energizing the starter mechanism likewise decreases. Accordingly, low cranking strength of a combustion engine battery is indicative that the strength or ability of the battery is no longer sufficient to properly carry the overall starting load for starting the motor.

Ordinarily, a combustion engine battery is characterized by a set of rated specifications and conditions of operation, such as 'cold cranking power or strength', typically indicated in terms of 'CCA' (cold cranking amperage), or, 'cranking capacity', commonly indicated in terms of 'AH' (ampere hours), and 'warranty lifetime', typically indicated in terms of number of months, which are used for selecting a battery appropriate for a particular combustion engine and/or for performing a particular application. Under regular, or irregular, operating and storage conditions, a combustion engine battery exhibits low cranking strength at some point during its lifetime. Eventually, when the cranking strength of the battery decreases below a particular threshold level, where the particular threshold level is determined according to specifications, characteristics, and operating behavior, of the starter mechanism of a particular combustion engine, the battery no longer enables the starter mechanism to effect the initial cranking of the crankshaft of the engine motor for starting the motor. In such an event, the battery is either recharged, or, is considered 'dead' and replaced by a new battery. Clearly, an important matter, potentially leading to a serious problem, for an operator of a combustion engine arises at the time the battery starts exhibiting low cranking strength.

There are various reasons why a combustion engine battery exhibits low cranking strength. First, focusing on the battery itself, as a consequence of the physicochemical composition and behavior of a standard combustion engine battery, maximum attainable battery voltage gradually decreases with time, even during normal operation and maintenance of the combustion engine. Second, focusing on operation of the overall electrical system of a combustion engine, since the battery is in electrical communication with multiple devices, mechanisms, and components, of the electrical system, a malfunction in one or more of such devices, mechanisms, or components, could cause abnormal and excessive drainage of battery voltage and therefore decrease cranking strength of the battery. For example, a malfunctioning starter mechanism may involve an overly excessive load being placed upon the battery during starting conditions, thereby accelerating loss of battery cranking strength. Alternatively, a malfunctioning charging mechanism, featuring standard electrical system components such as an alternator or generator and related circuitry and wiring to the battery, may be abnormally charging the battery during steady state operation of the combustion engine. Alternatively, a fault in the circuit, wiring, or activation, of an anti-theft alarm device, may involve a relatively small, but continuous, parasitic load being placed upon the battery during engine non-operating conditions, thereby gradually accelerating loss of battery cranking strength.

A third common cause of low cranking strength of a combustion engine battery focuses on the actions of an operator of a vehicle or device at, or following, the time of turning off the engine. For instance, at the time of turning off the engine, where the operator fails to turn-off lights used for either driving the vehicle or operating the device, or, following engine turn-off, where the operator activates an accessory such as an audio system or lights for an excessive duration. Leaving lights on, especially the main high-intensity headlights, following engine turn-off, for an extended period of time such as more than a couple of hours, produces the highly undesirable effect of significant, or deep, battery discharge, leading to accelerated loss of battery cranking strength and ultimately termination of battery function.

Typically, a combustion engine battery is only replaced following the inability of the battery to enable starting of the engine, as this involves placing the above described relatively high electromechanical starting load on the battery compared to low load engine accessories or devices. It is clearly desirable for a user of a combustion engine to be made aware of the early stage of low cranking strength of the battery prior to the inability of the battery to enable starting the engine. Such awareness is accomplished by either periodically, or continuously, testing or monitoring electrical characteristics and parameters of the combustion engine battery.

The field of testing, monitoring, and analyzing static and/or dynamic electrical characteristics and parameters, such as voltage or charge, current, charging/discharging, internal resistance, and temperature, of a combustion engine battery has become well developed, featuring numerous teachings of methods, devices, and systems, widely varying from relatively simple to quite complex and sophisticated. In general, battery testing, monitoring, and analyzing, methods, devices, and systems can be categorized as either 'out-of-service', or as 'in-use'. 'Out-of-service' refers to battery testing, monitoring, and analyzing, 'while the combustion engine is not in normal or typical daily use, or, is out-of-service', by an operator of the vehicle or device powered by the combustion engine. 'In-use' refers to battery testing, monitoring, and analyzing, 'while the combustion engine is in normal or typical daily, and, day-to-day, use', by an operator of the vehicle or device powered by the combustion engine.

Out-of-service applications typically involve a properly trained technician or engine operator using a separate dedicated computerized electronic engine analyzer or diagnosis center, located external to the combustion engine hosting the battery, for testing, monitoring, and analyzing the battery, while the combustion engine is 'out-of-service', usually, at some kind of auto service station or center. Disclosures in U.S. Pat. No. 4,423,379 to Jacobs et al., U.S. Pat. No. 4,423,378 to Marino et al., and U.S. Pat. No. 4,322,685 to Frailing et al., teach of out-of-service methods, devices, and systems. In each scenario, an externally generated electrical load is applied to the battery for determining the state or condition of the battery. Out-of-service applications are advantageous for performing complex and thorough testing, monitoring, and analysis of a combustion engine battery regarding its functioning in relation to the combustion engine, while the vehicle or device powered by the combustion engine is out-of-service, but, by definition, are unable to provide a vehicle or device operator early warning of low cranking strength of the battery while the vehicle or device is in-use.

The present invention focuses on in-use monitoring and analyzing the electrical condition, or 'state of health', of a combustion engine battery, for the objective of in-use detecting, and warning of, the development of low cranking strength of the battery during engine starting.

Disclosures by Palanisamy in U.S. Pat. Nos. 5,281,919; 4,968,942; and 4,937,528, feature methods and apparatus applicable as part of an engine, for in-use determining battery capacity, state of charge, and certain fault conditions. In these disclosures, ambient temperature, battery voltage, alternator/regulator output voltage, and current to and from the battery are continuously measured. Current-voltage (I-V) data is analyzed to determine the internal resistance and polarization of the battery. A microprocessor is used for programming a test current or voltage provided to the battery by the alternator/regulator.

In U.S. Pat. No. 5,339,017 to Yang, there is described a device for checking the charge state of a vehicle battery, featuring indirectly measuring internal resistance of the battery by measuring voltage of a capacitor charged by the battery. At higher capacitor voltage, internal resistance of the battery is lower, and the state of charge of the battery is considered inside the rated working range. The device provides visual display of capacitor voltage, thereby indicating battery internal resistance, which in turn shows the state of charge of the battery.

In U.S. Pat. No. 3,997,888 issued to Kremer, a device is described for in-use monitoring the state of charge of a battery during engine operation, featuring a voltage divider, a resistive bridge circuit, a current sensor, an operational amplifier, and a detector. During battery discharge, a reduction of battery voltage unbalances the resistive bridge circuit causing an opposite sense voltage compensation proportional to the discharge current measured by the current sensor. The device can also operate with a timer, a pulse generator, and a pulse counter for selectively actuating the detector, according to a predetermined threshold level of drop in battery voltage, for establishing an alarm condition corresponding to battery discharge.

In U.S. Pat. No. 4,193,026 issued to Finger et al., a device and method are disclosed for measuring the state of charge of a battery during its discharge from a charged condition, during engine operation, including a means for monitoring voltage output, a pulse generator, a means for counting or integrating pulses, and a means for producing a warning signal according to a pre-determined threshold level of rate of drop in battery voltage during the discharge time interval. Counting or integrating pulses of an intermediate output signal is initiated only after the device detects that the magnitude of the battery voltage falls below a threshold value during the discharge, and not from initiation of or during battery discharge.

In U.S. Pat. No. 4,665,370 to Holland, there is disclosed a method and apparatus for testing a combustion engine battery during engine starting. During each engine starting, the battery tester compares the unloaded voltage of the battery with the voltage under load, where the load is supplied by the cranking motor. Indication of low battery charge is based on analyzing a single event or data point corresponding to either the voltage difference being larger than a pre-determined value, or, the battery voltage dropping below a pre-determined value.

In U.S. Pat. No. 4,731,601 to Nowakowski et al., there is disclosed a method and device for testing the condition of a combustion engine cranking system, based on periodically measuring battery voltage during cranking, along with measuring battery and engine temperatures, and comparing the measured voltage to a set of predetermined voltage values associated with particular battery and engine temperatures during cranking.

In U.S. Pat. No. 4,943,777 to Nakamura et al., there is disclosed a device for determining the condition of a combustion engine battery during engine starting. Battery voltage is periodically measured, and a warning indication is given if the battery voltage falls below a predetermined relatively high value for relatively short periods of time, such as three seconds, or below a pre-determined higher voltage value for longer periods of time, such as a minute or longer.

In U.S. Pat. No. 5,818,333 to Yaffe et al., there is disclosed a device and method for in-use measuring voltage levels of a combustion engine battery and warning when the battery is about to run out, but is still able to start a vehicle motor, thereby allowing a vehicle operator to continue driving the vehicle, and prepare for timely replacement of the battery. The disclosed device includes a voltage level tester for measuring battery voltage at the end of a given engine starting time interval, a timer responsive to activation of a starter mechanism to time the given engine starting time interval, a counter for maintaining an incremental count of occasions on which the battery voltage is below a given level, and an alarm for providing a warning signal when the incremental count exceeds a pre-determined number of counts. In a preferred embodiment, the voltage level tester continuously measures the voltage across the battery, and the timer identifies activation of the starter mechanism by a corresponding sudden drop in voltage across the battery. In the disclosure of Yaffe et al., the warning signal, in the form of an audible alarm or visual signal, activates when the incremental count exceeds a given number, following, but not including, activation of the starter mechanism or motor.

Limitations relating to the combustion engine operator receiving and/or noticing the warning signal during implementation of the device and method of Yaffe et al. are successfully overcome in an improved device and method for measuring and warning of vehicle battery deterioration, disclosed by the same inventors, Zur et al., in U.S. Pat. No. 6,091,325. The disclosed device includes the same components as the device of the previous disclosure of Yaffe et al., and as the improvement, additionally includes components and steps for distinguishing between engine activation and engine non-activation, where engine non-activation includes engine turn-off, whereby the alarm activates for providing an additional warning signal of battery deterioration following engine turn-off. Accordingly, the warning signal activates a first time when the incremental count of below level battery voltage exceeds a given number following, but not including, activation of the starter mechanism or motor, and activates a second time when an engine characteristic level tester registers engine noise and/or vibration less than a threshold level corresponding to engine turn-off, so as to provide the vehicle operator an additional warning of battery charge deterioration, regardless of whether the first warning signal was actuated, noticed or heard.

Prior art techniques of in-use monitoring, analyzing, and indicating, the condition of a combustion engine battery are typically based upon measuring and analyzing electrical changes, focusing on detecting significant drops in battery voltage, relative to a reference voltage, without steps and/or components for detecting and logically analyzing a plurality of voltage changes generated specifically during activation of the starter mechanism 'from initiation of, and during, engine starting', and therefore, are limited in accuracy and precision with respect to in-use detecting, and/or warning of, low cranking strength of the battery during engine starting. Additionally, such prior art techniques include no enabling description for overcoming erroneous affects on detecting and analyzing changes in battery voltage caused by normally occurring random and/or periodic electromechanical noise and vibrations associated with engine starting.

There is thus a need for, and it would be highly advantageous to have a method and device for automatically in-use detecting low cranking strength of a combustion engine battery during engine starting. It is also desirable to have a method and device for in-use detecting low cranking strength of a combustion engine battery during engine starting, which enable overcoming erroneous effects of detecting and analyzing changes in battery voltage caused by random and/or periodic electromechanical noise and vibrations associated with engine starting. Furthermore, it is desirable to have the method and device optionally including steps and components for additionally controlling activation of an alarm, which provides in-use warning of the detected low cranking strength of the combustion engine battery, prior to engine turn-off, and optionally, following engine turn-off. Moreover, it is highly desirable to have such a method and device which are accurate, reliable, and, relatively simple and inexpensive to implement in a variety of combustion engines.

SUMMARY OF THE INVENTION

The present invention relates to a method and device for in-use detecting low cranking strength of a combustion engine battery during engine starting. The present invention optionally includes steps and components for additionally controlling activation of an alarm, for providing in-use warning of the detected low cranking strength of the combustion engine battery, prior to engine turn-off, and optionally, following engine turn-off.

It is therefore an object of the present invention to provide a method and device for in-use detecting low cranking strength of a combustion engine battery during engine starting.

It is a further object of the present invention to provide a method and device for in-use detecting low cranking strength of a combustion engine battery during engine starting, which enable overcoming erroneous effects of detecting and analyzing changes in battery voltage caused by random and/or periodic electromechanical noise and vibrations associated with engine starting.

It is a further object of the present invention to provide a method and device for in-use detecting low cranking strength of a combustion engine battery during engine starting, based on integrating relative changes in battery voltage during the initial cranking stage of engine starting, and analyzing preliminary indications of cranking strength of the battery prior to decisively warning the engine operator of low cranking strength of the battery.

It is another object of the present invention to provide a method and device for in-use detecting low cranking strength of a combustion engine battery during engine starting, optionally including steps and components for additionally controlling activation of an alarm, for providing in-use warning of the detected low cranking strength of the combustion engine battery, prior to engine turn-off, and optionally, following engine turn-off.

Thus, according to the present invention, there is provided a method for in-use detecting low cranking strength of a combustion engine battery during engine starting, the engine starting featuring activation and initiation of cranking of the combustion engine crankshaft by energy supplied by the combustion engine battery, the method comprising the steps of: (a) sensing time varying voltage of the battery by a comparator, from initiation of and during the engine starting; (b) comparing the time varying voltage of the battery to a constant reference DC voltage by the comparator, for forming a plurality of output signals of the comparator, from the initiation of and during the engine starting; (c) integrating the plurality of the output signals of the comparator by an integrator, for forming an output signal of the integrator, during the engine starting; (d) determining and responding to the output signal of the integrator by a detector, for forming an output signal of the detector, during the engine starting; and (e) determining and responding to the output signal of the detector by an alarm, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a method for in-use detecting low cranking strength of a combustion engine battery during engine starting, the engine starting featuring activation and initiation of cranking of the combustion engine crankshaft by energy supplied by the combustion engine battery, the method comprising the steps of: (a) sensing time varying voltage of the battery by a comparator, from initiation of and during the engine starting; (b) comparing the time varying voltage of the battery to a constant reference DC voltage by the comparator, for forming a plurality of output signals of the comparator, from the initiation of and during the engine starting; (c) integrating the plurality of the output signals of the comparator by an integrator, for forming an output signal of the integrator, during the engine starting; (d) determining and responding to the output signal of the integrator by a detector, for forming an output signal of the detector, during the engine starting; (e) determining and responding to the output signal of the detector by a one shot, for forming an output signal of the one shot, during the engine starting; (f) determining and responding to the output signal of the one shot by a counter, whereupon according to the output signal of the one shot the counter registers a count number of occurrences of the low cranking strength of the battery, for forming an output signal of the counter, during the engine starting; (g) determining and responding to the output signal of the integrator by a reset signal detector, for forming an output signal of the reset signal detector, substantially simultaneous to step (d) of the determining and the responding to the output signal of the integrator by the detector, during the engine starting; (h) delaying forwarding of the output signal of the reset signal detector by a reset delay, during the engine starting; (i) analyzing and responding to substantially simultaneous reception of the output signal of the one shot and the output signal of the reset delay by a reset logic circuit, for forming an output signal of the reset logic circuit, whereupon according to the output signal of the reset logic circuit sent to the counter, response of a counter reset mechanism associated with the counter is selected from the group consisting of activating for resetting the count number of the counter and remaining inactive by not resetting the count number of the counter, during the engine starting; and (j) determining and responding to the output signal of the counter by an alarm, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a method for in-use detecting low cranking strength of a combustion engine battery during engine starting, the engine starting featuring activation and initiation of cranking of the combustion engine crankshaft by energy supplied by the combustion engine battery, the method comprising the steps of: (a) sensing time varying voltage of the battery by an integrator, from initiation of and during the engine starting; (b) evaluating time varying difference between the time varying voltage of the battery and a constant reference DC voltage by the integrator, for forming a plurality of evaluated voltage differences, from the initiation of and during the engine starting; (c) integrating the plurality of the evaluated voltage differences by the integrator, for forming an output signal of the integrator, during the engine starting; (d) determining and responding to the output signal of the integrator by a detector, for forming an output signal of the detector, during the engine starting; and (e) determining and responding to the output signal of the detector by an alarm, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a method for in-use detecting low cranking strength of a combustion engine battery during engine starting, the engine starting featuring activation and initiation of cranking of the combustion engine crankshaft by energy supplied by the combustion engine battery, the method comprising the steps of: (a) sensing time varying voltage of the battery by an integrator, from initiation of and during the engine starting; (b) evaluating time varying difference between the time varying voltage of the battery and a constant reference DC voltage by the integrator, for forming a plurality of evaluated voltage differences, from the initiation of and during the engine starting; (c) integrating the plurality of the evaluated voltage differences by the integrator, for forming an output signal of the integrator, during the engine starting; (d) determining and responding to the output signal of the integrator by a detector, for forming an output signal of the detector, during the engine starting; (e) determining and responding to the output signal of the detector by a one shot, for forming an output signal of the one shot, during the engine starting; (f) determining and responding to the output signal of the one shot by a counter, whereupon according to the output signal of the one shot the counter registers a count number of occurrences of the low cranking strength of the battery, for forming an output signal of the counter, during the engine starting; (g) determining and responding to the output signal of the integrator by a reset signal detector, for forming an output signal of the reset signal detector, simultaneous to step (d) of the determining and the responding to the output signal of the integrator by the detector, during the engine starting; (h) delaying forwarding of the output signal of the reset signal detector by a reset delay, during the engine starting; (i) analyzing and responding to simultaneous reception of the output signal of the one shot and the output signal of the reset delay by a reset logic circuit, for forming an output signal of the reset logic circuit, whereupon according to the output signal of the reset logic circuit sent to the counter, response of a counter reset mechanism associated with the counter is selected from the group consisting of activating for resetting the count number of the counter and remaining inactive by not resetting the count number of the counter, during the engine starting; and (j) determining and responding to the output signal of the counter by an alarm, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a device for in-use detecting low cranking strength of a combustion engine battery during engine starting, the engine starting featuring activation and initiation of cranking of the combustion engine crankshaft by energy supplied by the combustion engine battery, the device comprising: (a) a constant reference DC voltage; (b) a comparator operatively connected to leads of the combustion engine battery and to the constant reference DC voltage, for sensing time varying voltage of the battery and for comparing the time varying voltage of the battery to the constant reference DC voltage, thereby forming a plurality of output signals of the comparator from initiation of and during the engine starting; (c) an integrator operatively connected to the comparator, for integrating the plurality of the output signals of the comparator, thereby forming an output signal of the integrator during the engine starting; (d) a detector operatively connected to the integrator, for determining and responding to the output signal of the integrator, thereby forming an output signal of the detector during the engine starting; and (e) an alarm operatively connected to the detector, for determining and responding to the output signal of the detector, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a device for in-use detecting low cranking strength of a combustion engine battery during engine starting, the engine starting featuring activation and initiation of cranking of the combustion engine crankshaft by energy supplied by the combustion engine battery, the device comprising: (a) a constant reference DC voltage; (b) a comparator operatively connected to leads of the combustion engine battery and to the constant reference DC voltage, for sensing time varying voltage of the battery and for comparing the time varying voltage of the battery to the constant reference DC voltage, thereby forming a plurality of output signals of the comparator from initiation of and during the engine starting; (c) an integrator operatively connected to the comparator, for integrating the plurality of the output signals of the comparator, thereby forming an output signal of the integrator during the engine starting; (d) a detector operatively connected to the integrator, for determining and responding to the output signal of the integrator, thereby forming an output signal of the detector during the engine starting; (e) a one shot operatively connected to the detector, for determining and responding to the output signal of the detector, thereby forming an output signal of the one shot during the engine starting; (f) a counter operatively connected to the one shot, for determining and responding to the output signal of the one shot, whereupon according to the output signal of the one shot the counter registers a count number of occurrences of the low cranking strength of the battery, thereby forming an output signal of the counter during the engine starting; (g) an alarm operatively connected to the counter, for determining and responding to the output signal of the counter, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off, (h) a counter reset mechanism associated with the counter, for resetting the count number of the occurrences of the low cranking strength of the battery; (i) a reset signal detector operatively connected to the integrator, for determining and responding to the output signal of the integrator, thereby forming an output signal of the reset signal detector during the engine starting; (j) a reset delay operatively connected to the reset signal detector, for delaying forwarding of the output signal of the reset signal detector during the engine starting; and (k) a reset logic circuit operatively connected to the one shot, operatively connected to the reset delay, and operatively connected to the counter, for analyzing and responding to substantially simultaneous reception of the output signal of the one shot and the output signal of the reset delay, thereby forming an output signal of the reset logic circuit, whereupon according to the output signal of the reset logic circuit sent to the counter, response of the counter reset mechanism associated with the counter is selected from the group consisting of activating for resetting the count number of the counter and remaining inactive by not resetting the count number of the counter, during the engine starting.

According to another aspect of the present invention, there is provided a device for in-use detecting low cranking strength of a combustion engine battery during engine starting, the engine starting featuring activation and initiation of cranking of the combustion engine crankshaft by energy supplied by the combustion engine battery, the device comprising: (a) a constant reference DC voltage; (b) an integrator operatively connected to leads of the combustion engine battery and to the constant reference DC voltage, for sensing time varying voltage of the battery, for evaluating time varying difference between the time varying voltage of the battery and the constant reference DC voltage, thereby forming a plurality of evaluated voltage differences from the initiation of and during the engine starting, and for integrating the plurality of the evaluated voltage differences, thereby forming an output signal of the integrator during the engine starting; (c) a detector operatively connected to the integrator, for determining and responding to the output signal of the integrator, thereby forming an output signal of the detector during the engine starting; and (d) an alarm operatively connected to the detector, for determining and responding to the output signal of the detector, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

According to another aspect of the present invention, there is provided a device for in-use detecting low cranking strength of a combustion engine battery during engine starting, the engine starting featuring activation and initiation of cranking of the combustion engine crankshaft by energy supplied by the combustion engine battery, the device comprising: (a) a constant reference DC voltage; (b) an integrator operatively connected to leads of the combustion engine battery and to the constant reference DC voltage, for sensing time varying voltage of the battery, for evaluating time varying difference between the time varying voltage of the battery and the constant reference DC voltage, thereby forming a plurality of evaluated voltage differences from the initiation of and during the engine starting, and for integrating the plurality of the evaluated voltage differences, thereby forming an output signal of the integrator during the engine starting; (c) a detector operatively connected to the integrator, for determining and responding to the output signal of the integrator, thereby forming an output signal of the detector during the engine starting; (d) a one shot operatively connected to the detector, for determining and responding to the output signal of the detector, thereby forming an output signal of the one shot during the engine starting; (e) a counter operatively connected to the one shot, for determining and responding to the output signal of the one shot, whereupon according to the output signal of the one shot the counter registers a count number of occurrences of the low cranking strength of the battery, thereby forming an output signal of the counter during the engine starting; (f) an alarm operatively connected to the counter, for determining and responding to the output signal of the counter, whereupon according to the determination by the alarm, the response by the alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off; (g) a counter reset mechanism associated with the counter, for resetting the count number of the occurrences of the low cranking strength of the battery; (h) a reset signal detector operatively connected to the integrator, for determining and responding to the output signal of the integrator, thereby forming an output signal of the reset signal detector during the engine starting; (i) a reset delay operatively connected to the reset signal detector, for delaying forwarding of the output signal of the reset signal detector during the engine starting; and (j) a reset logic circuit operatively connected to the one shot, operatively connected to the reset delay, and operatively connected to the counter, for analyzing and responding to substantially simultaneous reception of the output signal of the one shot and the output signal of the reset delay, thereby forming an output signal of the reset logic circuit, whereupon according to the output signal of the reset logic circuit sent to the counter, response of the counter reset mechanism associated with the counter is selected from the group consisting of activating for resetting the count number of the counter and remaining inactive by not resetting the count number of the counter, during the engine starting.

The present invention successfully address limitations of presently available methods, devices, and systems, by significantly increasing the effectiveness in terms of accuracy and reproducibility, in a safe and cost effective manner, of in-use detecting low cranking strength of a combustion engine battery during engine starting. The present invention enables overcoming erroneous affects of analyzing changes in battery voltage caused by random and/or periodic electromechanical noise and vibrations associated with engine starting. Moreover, limitations associated with providing a vehicle or device operator with in-use warning of low cranking strength of the battery during realistically unfavorable conditions of starting and operating the vehicle or device are overcome by the present invention providing an additional in-use warning of the detected low cranking strength of the battery, following engine turn-off.

Implementation and operation of the method and device of the present invention involve performing or completing selected tasks or steps manually, automatically, or a combination thereof. Moreover, according to actual instrumentation and equipment of the preferred embodiments of the method and device, several selected steps of the method could be implemented by appropriate hardware or software or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method of the invention could be described as being performed by a data processor, such as a computing platform for executing a plurality of instructions, associated with the vehicle or device operated by a combustion engine.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
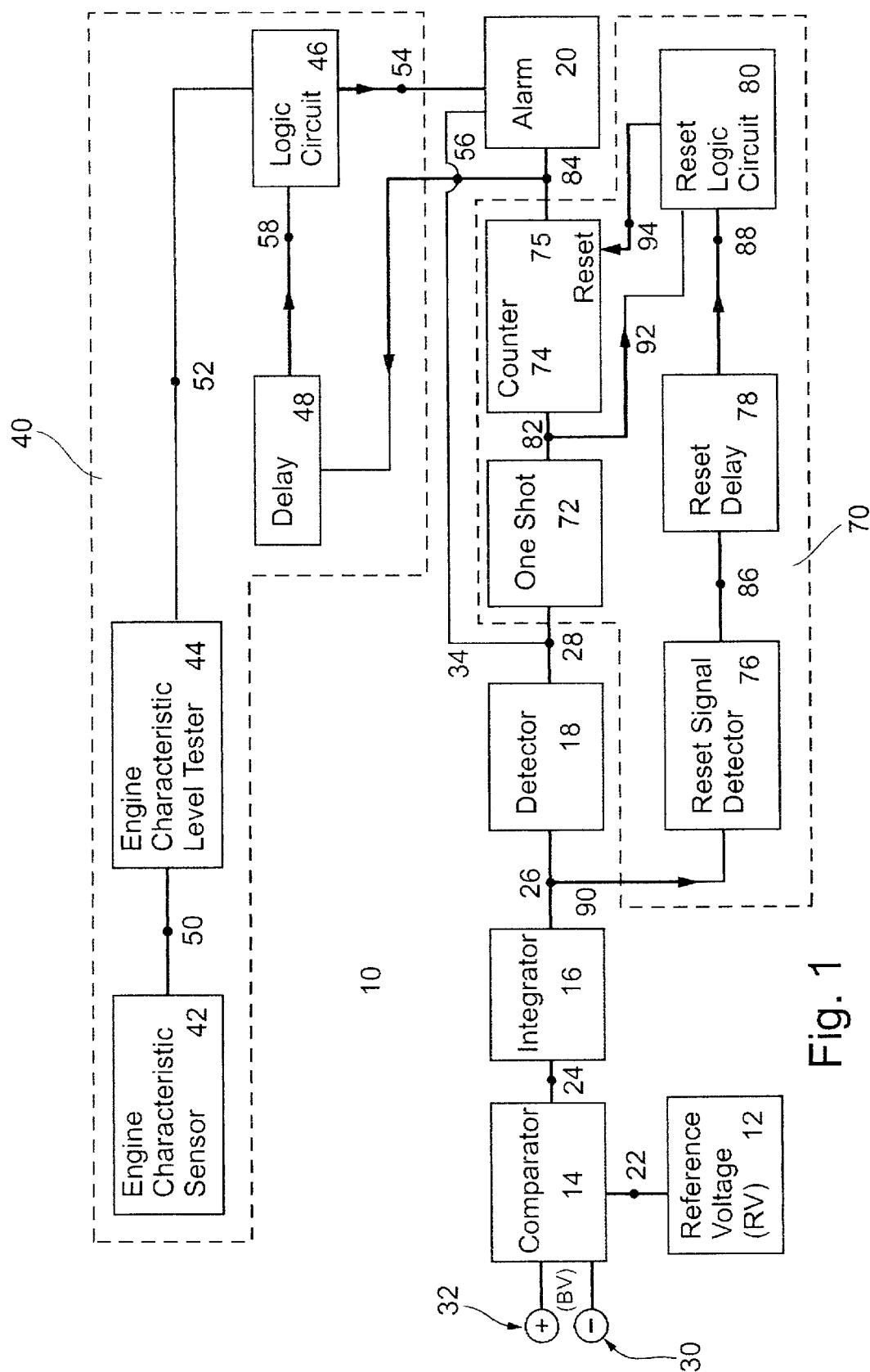
FIG. 1 is a block diagram illustrating the first preferred embodiment of the present invention, device 10, also showing optional features (indicated by dashed line enclosures) of a 'following engine turn-off warning sub-circuit' 40, and a 'counter/reset sub-circuit' 70.

The present invention relates to a method and device for in-use detecting low cranking strength of a combustion engine battery during engine starting. The present invention optionally includes steps and components for additionally controlling activation of an alarm, for providing in-use warning of the detected low cranking strength of the combustion engine battery, prior to engine turn-off, and optionally, following engine turn-off.

The method and device of the present invention feature the main novelty of continuously integrating changes in battery voltage specifically 'during engine starting', from the time the electro-mechanical starting load is initially applied to the battery, and logically analyzing values of the integrated changes in battery voltage during engine starting, for determining whether or not there is an initial stage of developing low cranking strength of the battery. Additional novelty of the present invention involves the optional inclusion of a counter reset mechanism for resetting a counter which counts the number of occurrences the device detects changes in battery voltage corresponding to low cranking strength of the battery during engine starting.

It has been unexpectedly observed by the inventors that, typically, during engine starting conditions, there are spontaneous, random and/or periodic, spikes or variations in battery voltage and/or changes in battery voltage as a function of time, above and/or below a given reference voltage or pre-determined level of change. Specifically, random and/or periodic electro-mechanical noise and vibrations associated with engine starting can cause spikes in battery voltage resulting in larger than normal drops in battery voltage, leading to a false alarm, by devices used for monitoring battery voltage levels, indicating the onset of battery voltage deterioration or low cranking strength, when in actuality, the battery exhibits normal cranking strength. Alternatively, random and/or periodic electromechanical noise and vibrations associated with engine starting can also cause spikes in battery voltage resulting in smaller than normal drops in battery voltage, leading to falsely indicating no onset of deteriorating voltage or cranking strength of the battery, when in actuality, the battery exhibits less than normal, or low cranking strength.

By integrating and analyzing battery voltage differences 'specifically during engine starting', the method and device of the present invention are significantly less sensitive to the above described random and/or periodic electromechanical disturbances during engine starting. This results in a more accurate and reliable method and device for in-use detecting low cranking strength of a combustion engine battery.

It is to be understood that the invention is not limited in its application to the details of construction, arrangement, and composition of the device set forth in the following description or drawings. The invention is capable of other embodiments or of being practiced or carried out in various ways. For example, any number of the electrical and/or electronic components or elements featured or included in the following described embodiments of the method and device may be either digital or analog, operatively connected and functioning in a corresponding digital, logical, or analog mode. Moreover, any connection among any number of the electrical or electronic components or elements of the device may be formed by using any combination of direct or mechanical means, and, indirect or electrical means such as in a circuit of the overall combustion engine vehicle or device electrical system, where any such mechanical and/or electrical connection may be internal or external to the engine compartment, in general, and internal or external to one or more appropriate components of the engine compartment, in particular. Also, it is to be understood that phraseology and terminology employed herein are for the purpose of description and should not be regarded as limiting.

Steps, components, operation, and implementation of a method and device for in-use detecting low cranking strength of a combustion engine battery during engine starting, according to the present invention, are better understood with reference to the following description and accompanying drawings.

Figure 2:
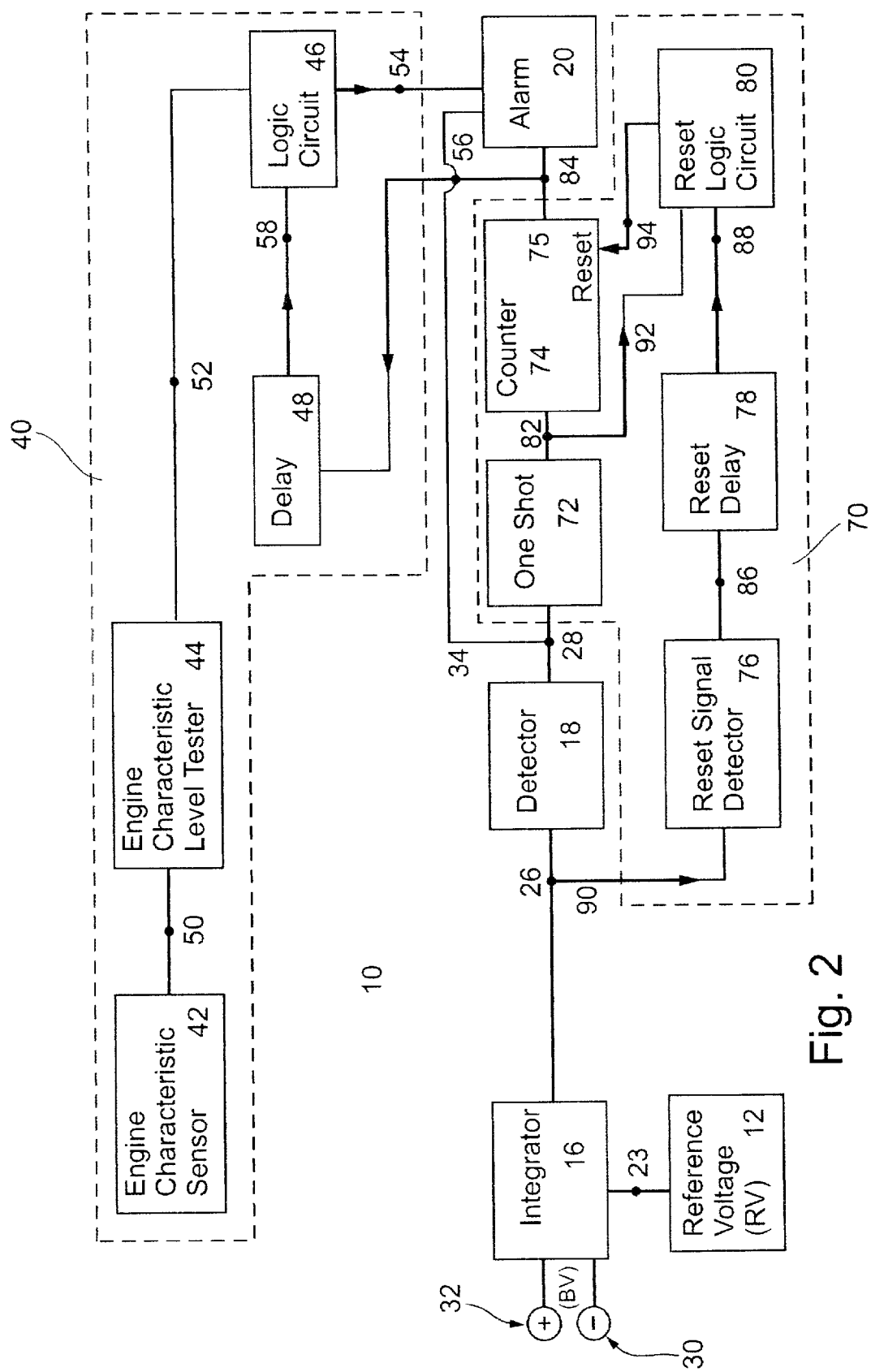
FIG. 2 is a block diagram illustrating the second preferred embodiment of the present invention, device 15, also showing optional features (indicated by dashed line enclosures) of 'following engine turn-off warning sub-circuit' 40, and 'counter/reset sub-circuit' 70.

Two preferred embodiments of the method and device of the present invention are herein described. The first preferred embodiment, illustrated in FIG. 1, is based on integrating logic values generated by a comparator 14 which compares and assigns logic values to changes in battery voltage relative to a constant reference voltage 12, during engine starting. Optional features in the first preferred embodiment, also shown in FIG. 1, indicated by the upper and lower dashed line enclosures, are the addition of a 'following engine turn-off warning sub-circuit' 40, and/or the addition of a 'counter/reset sub-circuit' 70, respectively. The second preferred embodiment, illustrated in FIG. 2, is based on integrating analog values of changes in battery voltage relative to constant reference voltage 12, without first comparing the voltage changes by comparator 14, during engine starting. Optional features in the second preferred embodiment, also shown in FIG. 2, indicated by the upper and lower dashed line enclosures, are the addition of 'following engine turn-off warning sub-circuit' 40, and/or the addition of 'counter/reset sub-circuit' 70, respectively.

Steps, components, and operation of the first preferred embodiment of the method and device of the present invention are herein further described. FIG. 1 is a block diagram illustrating the first preferred embodiment of the device of the present invention, generally designated 10, constructed and operative for in-use detecting low cranking strength of a combustion engine battery during engine starting, in accordance with the disclosed method. Device 10 (without reference to optional features of 'following engine turn-off warning sub-circuit' 40, and 'counter/reset sub-circuit' 70) features components: (a) a reference voltage 12, (b) a comparator 14, (c) an integrator 16, (d) a detector 18, and (e) an alarm 20. Device 10 also includes electrical or electronic circuit junctions 22, 24, 26, and 28, and, electrical or electronic signal path 34.

Device 10, preferably, is permanently connected to negative and positive battery leads, 30 and 32, respectively, during in-use operation of a combustion engine battery of a vehicle or device. As described in the above background section, the term 'in-use' refers to battery testing, monitoring, and analyzing, 'while the combustion engine is in normal or typical daily, and, day-to-day, use', by an operator of the vehicle or device powered by the combustion engine, including prior to engine starting, while the engine operates, and following engine turn-off. This is to be clearly distinguished from 'out-of-service' applications involving a properly trained technician or engine operator using a separate dedicated computerized electronic engine analyzer or diagnosis center, located external to the combustion engine hosting the battery, for testing, monitoring, and analyzing the battery, while the combustion engine is 'out-of-service', usually, at some kind of auto service station or center.

Device 10 operates on the principle that the battery supplies the necessary electrical energy, in the form of voltage and current, corresponding to an electromechanical starting load, to the starter mechanism (not shown) for effecting the initial cranking of the crankshaft of the engine motor until the motor is started, and therefore, until the crankshaft continuously operates by energy supplied to the motor by a generator or alternator, without depending solely upon the battery.

In Step (a) of the first preferred embodiment of the method, there is sensing the time varying voltage of the battery by a comparator 14, from initiation of, and during, engine starting, as a result of an operator turning an ignition key or depressing an ignition button of the vehicle or device for activating the starter mechanism and initiating cranking of the motor crankshaft.

Comparator 14 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, hereinafter also referred to as battery voltage, BV, is continuously or discontinuously sensed by comparator 14 from initiation of, and during, engine starting.

In Step (b), there is comparing the time varying battery voltage, BV, to a constant reference DC voltage 12, hereinafter also referred to as reference voltage, RV, by comparator 14, for forming a plurality of output signals of comparator 14, from initiation of, and during, engine starting, including, during the initial cranking of the engine crankshaft.

Reference voltage 12 is supplied by a device or a component, preferably set prior to or at the time of installation of device 10 in the combustion engine, and is sent to comparator 14 via circuit junction 22. Reference voltage, RV, is set at a value corresponding to less than normal, but, sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

Comparator 14 provides a digital, preferably, logic value, '0' or '1', output signal via circuit junction 24. In particular, for battery voltage, BV, larger than reference voltage, RV, such that (BV−RV) is positive, comparator output signal is assigned the value '0', a likely, but not definitive, indication of normal cranking strength of the battery. In contrast, for battery voltage, BV, equal to or less than reference voltage, RV, such that (BV−RV) becomes zero or negative, respectively, comparator output signal is assigned the value '1', a likely, but not definitive, indication of low, also referred to as less than normal, cranking strength of the battery.

Prior to activation and initial turning of the crankshaft and engine starting, the electromechanical starting load of the starter mechanism is relatively low, such that (BV−RV) is normally positive, resulting in a comparator output signal of '0'. During and immediately following activation and initial turning of the crankshaft via the cranking strength of the battery, in the relatively short initial time interval of engine starting, typically of the order of one second, the electromechanical load significantly increases, along with a corresponding significant and sharp drop in battery voltage, such that (BV−RV) normally decreases sharply with time, possibly even being negative, at least until the time when the engine generator or alternator starts operating for charging the battery. Hereinafter, two generally applicable scenarios of battery behavior are described with respect to implementation and operation of the present invention.

In scenario (1), where the battery exhibits normal cranking strength during engine starting, following the initial time interval of engine starting during which (BV−RV) may normally become negative due to the starting load, (BV−RV) is normally positive, such that the comparator output signal is normally '0'. However, during the complete, not just initial, time interval of engine starting, normally occurring random and/or periodic electromechanical noise and vibrations associated with the engine starting, cause random and/or periodic spikes or variations in the battery voltage, BV, resulting in random and/or periodic changes in (BV−RV), including occurrences of (BV−RV) being equal to zero or negative, whereby the comparator output signal changes to '1' (erroneously representing preliminary indication of low, or less than normal, cranking strength of the battery), immediately followed by changing back to '0' following the end of each such voltage spike or variation.

In scenario (2), where the battery exhibits low, or less than normal, cranking strength during engine starting, following the initial time interval of engine starting during which (BV−RV) may normally become negative due to the starting load, (BV−RV) remains negative or may become zero, such that the comparator output signal changes from being initially '0' prior to engine starting, to '1'. However, during the complete, not just initial, time interval of engine starting, normally occurring random and/or periodic electromechanical noise and vibrations associated with the engine starting, cause random and/or periodic spikes or variations in the battery voltage, BV, resulting in random and/or periodic changes in (BV−RV), including occurrences of (BV−RV) being positive, whereby the comparator output signal changes to '0' (erroneously representing preliminary indication of normal cranking strength of the battery), immediately followed by changing back to '1' following the end of each such voltage spike or variation.

In each scenario (1) or (2), immediately following the complete time interval of engine starting, when the engine generator or alternator starts operating for charging the battery, battery voltage, BV, normally increases until reaching a steady-state range, whereby (BV−RV) normally remains positive, such that the comparator output signal remains '0', during continued operation of the engine. By the time this occurs, the main measuring, decision making, and action, steps of the presently disclosed method are complete, whereby, according to scenario (1) or (2) and the below described steps, alarm 20 either remains inactive, or, is to be activated, respectively, for providing an in-use warning signal of low cranking strength of the battery to the combustion engine operator, during, or following, engine starting, prior to engine turn-off.

In Step (c), there is integrating the output signal of comparator 14, by integrator 16, during the engine starting.

The output signal of comparator 14 is continuously or discontinuously sent to integrator 16 via circuit junction 24. Integrator 16 integrates a stream or plurality of logic values, '0' and '1', corresponding to time changes in the comparator output signal. During the above described engine starting, (BV−RV) can be positive, or, zero or negative, such that the comparator output signal changes between '0' and '1', respectively. Accordingly, integration of the comparator output signal results only in a non-negative value.

Integrator 16 takes into account, by integrating over, all the random and/or periodic spikes or variations in the battery voltage, BV, and therefore, all the random and/or periodic changes in (BV−RV), including occurrences of (BV−RV) being unexpectedly zero or negative, or positive, whereby comparator output signal unexpectedly changes to '1' or to '0', respectively, immediately followed by changing back to '0' or to '1', respectively, following the end of each voltage spike or variation, during engine starting. By including integrator 16 in the circuit of device 10, the potentially erroneous affects of voltage spikes or variations on accurately and reproducibly determining the condition of low cranking strength of the battery during engine starting are at least minimized, if not entirely eliminated.

In Step (d) there is determining and responding to the output signal of integrator 16, by detector 18, during engine starting.

The output signal of integrator 16 is continuously or discontinuously sent to detector 18 via circuit junction 26. Detector 18 determines if the value of the integrator output signal is less than, or, equal to or greater than, a pre-determined value of detector 18, hereinafter, also referred to as PDV-D. According to the result of this decision making step, the responsive output signal of detector 18 is a digital, preferably, logic value, '0' or '1', respectively.

Pre-determined value of detector 18, PDV-D, is preferably, but not limited to being, set at a positive value, representing a larger than normal decrease in battery voltage during engine starting, corresponding to less than normal, but, still sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

In scenario (1), where the battery exhibits normal cranking strength during engine starting, (BV–RV) is usually positive (however, as described above in Step (b), there are negative contributions of (BV–RV) due to normally occurring random and/or periodic electromechanical noise and vibrations associated with the engine starting, causing random and/or periodic negative spikes or variations in the battery voltage, BV), such that comparator output signal is usually '0', translating to an integrator output signal equal to zero, or, positive and close to zero. In this scenario, the integrator output signal is less than the pre-determined value, PDV-D, whereby the output signal of detector 18 is assigned the value '0'.

In scenario (2), where the battery exhibits low, or less than normal, cranking strength during engine starting, (BV–RV) is usually negative (however, as described above in Step (b), there are positive contributions of (BV–RV) due to normally occurring random and/or periodic electromechanical noise and vibrations associated with the engine starting, causing random and/or periodic positive spikes or variations in the battery voltage, BV), such that comparator output signal is usually '1', translating to an integrator output signal greater than one, with time. In this scenario, the integrator output signal is equal to or greater than the pre-determined value, PDV-D, whereby the output signal of detector 18 is assigned the value '1'.

In Step (e) there is determining and responding to the output signal of detector 18, by alarm 20, during, or following, engine starting, prior to engine turn-off.

The output signal of detector 18 is continuously or discontinuously sent to alarm 20 via circuit junction 28, along signal path 34. Alarm 20 determines if the value of the detector output signal is '0' or '1', and responds by either remaining inactive, or, activating, respectively, for providing an in-use warning signal of low cranking strength of the battery to the combustion engine operator, during, or following, engine starting, prior to engine turn-off.

In scenario (1), where the battery exhibits normal cranking strength during engine starting, the output signal of detector 18 is '0', whereby alarm 20 responds by remaining inactive, providing no in-use warning signal of low cranking strength of the battery, during, or following, engine starting.

In scenario (2), where the battery exhibits low, or less than normal, cranking strength during engine starting, the output signal of detector 18 is '1', whereby alarm 20 responds by activating for providing an in-use warning signal of low cranking strength of the battery to the combustion engine operator, during, or following, engine starting, prior to engine turn-off. The in-use warning signal of low cranking strength of the battery may be any combination of a, once occurring or automatically recurring, audible signal, visual signal, and, electromagnetic signal, generated internal and/or external to the vehicle or device powered by the combustion engine.

Some specific examples of warning signals are an audible signal sounding inside the operator compartment of the vehicle or device, a visual signal appearing on the dashboard display, on the inside rear-view mirror, and/or on the front windshield, inside the operator compartment of the vehicle or device, and, an electromagnetic signal, such as a wireless warning signal generated and/or received either internal or external to the operator compartment of the vehicle or device. Thus, assuming the engine operator notices, or is made aware of, the in-use warning signal of low cranking strength of the battery, the operator can plan to either recharge or replace the battery prior to the battery having insufficient cranking strength for activating the starter mechanism and initiating the turning of the crankshaft, thereby failing to enable starting the engine.

An important objective of the present invention, providing an in-use warning signal of the detected low cranking strength of the battery to the combustion engine operator, during, or following, engine starting, prior to engine turn-off, may not be achieved for one or a combination of the following realistically limiting reasons.

First, during, or following, engine starting, activation of a standard audible alarm may be insufficiently loud to overcome normal background noise internal and/or external to a combustion engine vehicle or device, continuing henceforth from engine starting, in order to be effectively heard by the engine operator. With respect to noise internal to the vehicle or device, this is especially the case if vehicle or device accessories such as a radio and/or a climate control mechanism are simultaneously activated with engine starting, a situation quite commonly occurring as a consequence of a vehicle or device operator failing to turn-off all accessories prior to the time of previous engine turn-off. Moreover, depending upon the immediate environment of the initially parked vehicle or device, an audible alarm simply may not be able to compete with substantially higher decibel levels of noise external to the vehicle or device, especially in urban and/or construction environments.

Second, during, or following, engine starting, activation of a battery low cranking strength visual warning signal appearing, for example, somewhere along the operator side of the vehicle or device dashboard, may not be noticed among the standard multitude of visual signals also displayed along the operator side of the vehicle or device dashboard during the time of engine starting. Third, following engine starting, the audible alarm and/or visual signal may malfunction or even be entirely absent due to a spontaneously temporary circuit failure.

These three limitations associated with providing an in-use warning signal of low cranking strength of the battery to the combustion engine operator, during, or following, engine starting, are successfully overcome by optionally including in device 10 of the present invention, a 'following engine turn-off warning sub-circuit' 40, indicated by the upper dashed line enclosure in FIG. 1. Components and steps of operation of following engine turn-off warning sub-circuit 40, are based on the disclosure, U.S. Pat. No. 6,091,325, issued to Zur et al., the same inventor of the present invention, entitled, "An improved device and method for measuring and warning of vehicle battery deterioration", which is incorporated by reference for all purposes as if set forth herein.

Accordingly, in the first preferred embodiment of the present invention, device 10 optionally including following engine turn-off warning sub-circuit 40 (FIG. 1, without reference to optional counter/reset sub-circuit 70 indicated by the lower dashed line enclosure) features above described components: (a) reference voltage 12, (b) comparator 14, (c) integrator 16, (d) detector 18, (e) alarm 20, and further includes additional components: (f) at least one engine characteristic sensor 42 selected from the group consisting of engine noise sensors and engine vibration sensors, operatively connected, to the combustion engine and/or to the vehicle or device, for sensing at least one engine characteristic selected from the group consisting of engine noise and engine vibration, (g) at least one engine characteristic level tester 44 selected from the group consisting of engine noise level testers and engine vibration level testers, operatively connected, to the at least one engine characteristic sensor 42 via circuit junction 50, so as to measure the at least one engine characteristic of engine noise and/or engine vibration, and to compare the measurement to a corresponding pre-determined threshold level of the at least one engine characteristic of engine noise and/or engine vibration, for distinguishing between engine activation and engine non-activation, where engine non-activation includes engine turn-off, (h) a logic circuit 46 operatively connected, to the at least one engine characteristic level tester 44 via circuit junction 52 and to alarm 20 via circuit junction 54, for performing at least one 'AND' logic operation on a first signal received from engine characteristic level tester 44 and on a delayed second signal received from detector 18, such that logic circuit 46 upon completing the correct 'AND' logic operation activates alarm 20 for providing an 'additional' in-use warning signal of low cranking strength of the battery, following engine turn-off, and (i) a delay mechanism 48 operatively connected, to detector 18 via circuit junction 56 and signal path 34, and to logic circuit 46 via circuit junction 58, for effecting the delay of the delayed second signal sent from detector 18 to logic circuit 46 so as to effect activation of alarm 20, for providing the additional in-use warning signal of low cranking strength of the battery, following engine turn-off.

As an extension of above described scenario (2), where the battery exhibits low, or less than normal, cranking strength during engine starting, alarm 20, in device 10 including optional following engine turn-off sub-circuit 40, provides a first in-use warning signal of low cranking strength of the battery to the engine operator, during, or following, engine starting, when the output signal of detector 18 is '1', and activates an additional time when engine characteristic level tester 44 registers an engine characteristic of engine noise and/or engine vibration less than a threshold level corresponding to engine turn-off, so as to provide the engine operator an additional in-use warning signal of low cranking strength of the battery, following engine turn-off, regardless of whether the first in-use warning signal of low cranking strength of the battery was activated, heard, or noticed by the engine operator.

Accordingly, the first preferred embodiment of the method of the present invention, optionally including following engine turn-off warning sub-circuit 40, as shown in FIG. 1, features above described Steps (a) through (e), and further includes the following Steps (f) through (i):

In Step (f), there is sensing at least one engine characteristic selected from the group consisting of engine noise and engine vibration, by at least one engine characteristic sensor 42.

In Step (g), there is measuring the at least one engine characteristic of the engine and comparing the at least one engine characteristic to at least one corresponding pre-determined threshold level of the engine characteristic for distinguishing between engine activation and engine non-activation, the engine non-activation including engine turn-off. This step features operation of at least one engine characteristic level tester 44.

In Step (h), there is performing at least one 'AND' logic operation on a first signal corresponding to the at least one engine characteristic and on a delayed second signal sent from detector 18 corresponding to the cranking strength of the battery being below the pre-determined value, PDV-D, of detector 18. This step features operation of logic circuit 46 and delay mechanism 48.

In Step (i), there is upon completing a particular 'AND' logic operation, activating alarm 20 for providing an additional in-use warning signal of low cranking strength of the battery, following engine turn-off. This additional in-use warning signal of low cranking strength of the battery may be any combination of a, once occurring or automatically recurring, audible signal, visual signal, and, electromagnetic signal, generated internal and/or external to the vehicle or device powered by the combustion engine.

Another optional feature of the first preferred embodiment of the present invention is the addition of steps and components enabling counting individual events of detecting the development of low cranking strength of the battery, during engine starting. Implementation of this optional feature is accomplished by the addition of a 'counter/reset sub-circuit' 70, to device 10, as shown in FIG. 1, indicated by the lower dashed line enclosure. The advantage of including this optional feature in the invention is for enabling additional control of providing the warning signal to the engine operator, during the step (Step (e) above) of determining and responding to the output signal of detector 18, by alarm 20, during, or following, engine starting, prior to engine turn-off.

Accordingly, the first preferred embodiment of the present invention, device 10 optionally including counter/reset sub-circuit 70 (FIG. 1, without reference to optional following engine turn-off sub-circuit 40 indicated by the upper dashed line enclosure) features above described components: (a) reference voltage 12, (b) comparator 14, (c) integrator 16, (d) detector 18, (e) alarm 20, and further includes additional components: (f) a one shot 72, (g) a counter 74, (h) a counter reset mechanism 75 associated with counter 74, (i) a reset signal detector 76, (j) a reset delay 78, and (k) a reset logic circuit 80. Here, device 10 also includes electrical or electronic circuit junctions 82, 84, 86, 88, and 94, and, electrical or electronic signal paths 90 and 92.

Accordingly, the first preferred embodiment of the method of the present invention, optionally including counter/reset sub-circuit 70 (FIG. 1, without reference to optional following engine turn-off sub-circuit 40), features above described Steps (a) through (d), and further includes the following Steps (e) through (j):

In Step (e) there is determining and responding to a change in the output signal of detector 18, by one shot 72, during engine starting.

One shot 72, being a commonly known 'mono-stable' electronic component, normally provides a single or mono-stable digital output signal, preferably, a logic value, '0' or '1'. The output signal of detector 18 is continuously or discontinuously sent to one shot 72 via circuit junction 28. During engine starting, one shot 72 determines if there is a change in the output signal of detector 18, for example, from '0' to '1', and responds accordingly by changing the output signal of one shot 72, for example, from '0' to '1', respectively, for an 'unstable', or pre-determined, time interval, hereinafter referred to as T[one shot].

In scenario (1), where the battery exhibits normal cranking strength during engine starting, the output signal of detector 18 is '0', whereby one shot 72 responds by remaining in its mono-stable state with an output signal of '0'.

In scenario (2), where the battery exhibits low, or less than normal, cranking strength during engine starting, the output signal of detector 18 changes from '0' to '1', whereby one shot 72 determines this change, and responds accordingly by changing the output signal of one shot 72 from '0' to '1', for the duration of the pre-determined time interval, T[one shot], even if during T[one shot] the output signal of detector 18 changes back from '1' to '0'.

In Step (f) there is determining and responding to the output signal of one shot 72, by counter 74, during engine starting.

The output signal of one shot 72 is continuously or discontinuously sent to counter 74 via circuit junction 82. Counter 74 is for maintaining a cumulative or incremental count number of each occurrence device 10 determines that the battery exhibits low, or less than normal, cranking strength during engine starting. An internal mechanism (not shown) of counter 74 counts the number of occurrences of low cranking strength of the battery in an analog mode, for example, 0, 1, 2, 3, 4, 5, . . . , but provides a digital, preferably, logic value, '0' or '1', output signal to alarm 20. When counter 74 registers or determines a count number of occurrences of low, or less than normal, cranking strength of the battery, equal to a pre-determined count number, hereinafter, also referred to as PDCN-C, for example, 0, or, 1, or, 2, or, 3, or, 4, or, 5, counter 74 sends an output signal via circuit junction 84 for activating alarm 20.

In scenario (1), where the battery exhibits normal cranking strength during engine starting, detector 18 determines the value of the output signal of integrator 16 to be less than the pre-determined value of detector 18, PDV-D, such the output signal of detector 18 is '0', and the output signal of one shot 72 remains at '0', according to scenario (1), described above in Steps (d)–(e). Accordingly, counter 74 responds by not incrementing its current count number of occurrences of low cranking strength of the battery, continuing to register a count number of occurrences of low, or less than normal, cranking strength of the battery less than PDCN-C, and provides an output signal of '0' via circuit junction 84 to alarm 20.

In scenario (2), where the battery exhibits low, or less than normal, cranking strength during engine starting, detector 18 determines the value of the output signal of integrator 16 to be equal to or greater than the pre-determined value of detector 18, PDV-D, such that the output signal of detector 18 changes from '0' to '1', and the output signal of one shot 72 changes from '0' to '1' for the pre-determined time interval, T[one shot], according to scenario (2), described above in Steps (d)–(e). Accordingly, counter 74 responds by incrementing its count number of occurrences of low cranking strength of the battery. When counter 74 registers a count number equal to PDN-C, counter 74 sends an output signal of '1' via circuit junction 84 for activating alarm 20, whereby alarm 20 responds by providing an in-use warning signal of low cranking strength of the battery to the combustion engine operator, during, or following, engine starting, prior to engine turn-off.

In scenario (2), the output signal of one shot 72 remains at '1' for the pre-determined time interval, T[one shot], in order to prevent activation of a counter reset mechanism 75 associated with counter 74, for resetting counter 74, according to the appropriate output signal sent by reset logic circuit 80, as described below in Step (g) through Step (i).

In Step (g) there is determining and responding to the output signal of integrator 16, by reset signal detector 76, during engine starting, substantially simultaneous to above described Step (d) of determining and responding to the output signal of integrator 16, by detector 18, during engine starting.

The output signal of integrator 16 is continuously or discontinuously sent to reset signal detector 76 via circuit junction 26, along signal path 90. Reset signal detector 76 determines if the output signal of integrator 16 is less than, or, equal to or greater than, a pre-determined value of reset signal detector 76, hereinafter, also referred to as PDV-RS. According to the result of this decision making step, the responsive output signal of reset signal detector 76 is a digital, preferably, logic value, '0' or '1', respectively.

Pre-determined value of reset signal detector 76, PDV-RS, is set at a value representing a normally occurring large decrease in battery voltage during engine starting, corresponding to normal cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine. The magnitude of PDV-RS of reset signal detector 76 is set less than the magnitude of the pre-determined value of detector 18, PDV-D, since, as previously described above in Step (d), pre-determined value of detector 18, PDV-D, is set at a value representing a larger than normal decrease in battery voltage during engine starting, corresponding to less than normal, but, still sufficient, cranking strength of the battery required for activating and initiating turning of the crankshaft during engine starting.

Accordingly, the responsive output signal of reset signal detector 76 changes from '0' to '1' during each scenario of engine starting, including scenario (1) where the battery exhibits normal cranking strength during engine starting, or, scenario (2) where the battery exhibits low, or less than normal, cranking strength during engine starting. As such, reset signal detector 76 serves as an engine starting indicator, activating upon any significant decrease in battery voltage corresponding to engine starting, in general, and to activation and initiation of cranking of the crankshaft, in particular.

In Step (h) there is delaying the forwarding of the output signal of reset signal detector 76, by reset delay 78, during engine starting.

The output signal of reset signal detector 76 is continuously or discontinuously sent to reset delay 78 via circuit junction 86. In scenario (2), during the time interval of engine starting with low cranking strength of the battery, as a consequence of PDV-RS of reset signal detector 76 being set less than PDV-D of detector 18, the output signal of reset signal detector 76 changes in time from '0' to '1' before the output signal of detector 18 changes from '0' to '1'.

In this particular exemplary configuration of the first preferred embodiment of the present invention, optionally including counter/reset sub-circuit 70, the objective of including reset delay 78 in device 10 is for delaying the forwarding of the output signal of reset signal detector 76, for a pre-determined time interval, hereinafter, also referred to as T[reset delay], until integrator 16 completes its function according to above described Step (c) of integrating the output signal of comparator 14 during engine starting, and also until one shot 72 completes its function according to above described Step (e) of determining and responding to a change in the output signal of detector 18 during engine starting. The pre-determined time interval, T[reset delay], of reset delay 78, is typically set at a value, for example, a fraction of a second, which is significantly less than the value, for example, one second, of the pre-determined time interval, T[one shot], of one shot 72, for properly enabling completion of Step (c) through Step (e).

In Step (i) there is analyzing and responding to the substantially simultaneous reception of the output signal of one shot 72 and the output signal of reset delay 78 by reset logic circuit 80, during engine starting.

The output signal of one shot 72 is continuously or discontinuously sent to reset logic circuit 80 via circuit junction 82, along signal path 92, while the output signal of reset delay 78 is continuously or discontinuously sent to reset logic circuit 80 via circuit junction 88. Reset logic circuit 80 performs a logic operation on the values of these input signals, and determines if there is to be a resetting of counter 74. According to the result of this decision making step, the responsive output signal of reset logic circuit 80 is a digital, preferably, logic value, '1' or '0', according to scenario (1) where the battery exhibits normal cranking strength during engine starting, or, scenario (2) where the battery exhibits low, or less than normal, cranking strength during engine starting, respectively.

Reset logic circuit 80 operates according to three sub-steps, as follows:

In sub-step (1) of Step (i), reset logic circuit 80 inverts the received output signal of one shot 72, for example, digital logic value '0' or '1', for forming an inverted output signal of one shot 72, for example, digital logic value '1' or '0', respectively, according to above described scenario (1), or, scenario (2), respectively.

In sub-step (2) of Step (i), reset logic circuit 80 performs an 'AND' logic operation on both the value of the inverted output signal of one shot 72, '1' or '0', of sub-step (1), and on the value of the output signal of reset delay 78, '1'. As described above in Step (g), the output signal of reset signal detector 76 always changes from '0' to '1' during each above described scenario (1) or (2) of engine starting, whereby during engine starting, the value of the output signal of reset delay 78 always changes from '0' to '1'. Accordingly, the result of the 'AND' logic operation is either '1' 'AND' '1', or, '0' 'AND' '1', according to above described scenario (1), or, scenario (2), respectively.

In sub-step (3) of Step (i), reset logic circuit 80 responds to the result of the 'AND' logic operation of sub-step (2), by sending a corresponding output signal, '1' or '0', according to above described scenario (1), or, scenario (2), respectively, to counter 74 via circuit junction 94, whereby counter reset mechanism 75 associated with counter 74 responds by either activating, or, remaining inactive, for resetting counter 74, respectively.

In Step (j) there is determining and responding to the output signal of counter 74, by alarm 20, during, or, following, the engine starting, prior to engine turn-off.

The output signal of counter 74 is continuously or discontinuously sent to alarm 20 via circuit junction 84. As described above in Step (i), the output signal of counter 74 is a digital, preferably, logic value, '0' or '1', according to scenario (1), or, scenario (2), respectively.

In scenario (1), where the battery exhibits normal cranking strength during engine starting, counter 74 determines that the registered count number, for example, 0, or, 1, or, 2, or, 3, or, 4, of occurrences of low cranking strength of the battery is less than PDCN-C, for example, 5, and sends an output signal of '0' via circuit junction 84 to alarm 20, whereby alarm 20 responds by remaining inactive, providing no in-use warning signal of low cranking strength of the battery, during, or following, engine starting.

In scenario (2), where the battery exhibits low, or less than normal, cranking strength during engine starting, counter 74 determines that the registered count number, for example, 5, of occurrences of low cranking strength of the battery is equal to PDCN-C, for example, 5, and sends an output signal of '1' via circuit junction 84 to alarm 20, whereby alarm 20 responds by providing an in-use warning signal of low cranking strength of the battery to the combustion engine operator, during, or following, engine starting, prior to engine turn-off.

A summary of the sequence of events relating to operation of optional counter/reset circuit 70 in the first preferred embodiment of the present invention is as follows:

In scenario (1), where the battery exhibits normal cranking strength during engine starting, the output signal of detector 18 is '0', such that the output signal of one shot 72 remains at '0', causing no incremental increase in the count number of counter 74, whereby counter 74 determines that the count number, for example, 0, or, 1, or, 2, or, 3, or, 4, of occurrences of low cranking strength of the battery is less than PDCN-C, for example, 5, while the output signal of reset signal detector 76 and of reset delay 78 each change from '0' to '1'. Reset logic circuit 80 inverts the received output signal of one shot 72 from '0' to '1', and performs the 'AND' logic operation on these input signal values of '1' 'AND' '1', resulting in an output signal of '1' being sent to counter 74, whereby counter reset mechanism X75X associated with counter 74 responds by resetting the current count number of, for example, 0, or, 1, or, 2, or, 3, or, 4, to zero, followed by counter 74 sending an output signal of '0' to alarm 20, whereby alarm 20 responds by remaining inactive, providing no in-use warning signal of low cranking strength of the battery, during, or following, engine starting.

In scenario (2), where the battery exhibits low, or less than normal, cranking strength during engine starting, the output signal of detector 18 changes from '0' to '1', such that the output signal of one shot 72 changes from '0' to '1', causing an incremental increase in the count number of counter 74, for example, from 0 to 1, or, from 1 to 2, or, from 2 to 3, or, from 3 to 4, or, from 4 to 5, whereby counter 74 determines that the new count number, for example, 5, of occurrences of low cranking strength of the battery is equal to PDCN-C, for example, 5, while the output signal of reset signal detector 76 and of reset delay 78 each change from '0' to '1'. Reset logic circuit 80 inverts the received output signal of one shot 72 from '1' to '0', and performs the 'AND' logic operation on these input signal values of '0' 'AND' '1', resulting in an output signal of '0' being sent to counter 74, whereby counter reset mechanism X75X associated with counter 74 responds by not resetting the new count number of, for example, 5, to zero, followed by counter 74 sending an output signal of '1' to alarm 20, whereby alarm 20 responds by providing an in-use warning signal of low cranking strength of the battery to the combustion engine operator, during, or following, engine starting, prior to engine turn-off.

The first preferred embodiment of the present invention (FIG. 1), optionally including the additional control during the step (Step (e) above) of determining and responding to the output signal of detector 18, by alarm 20, during, or following, engine starting, including components and operation of optional counter/reset sub-circuit 70, as just described above in Step (a) through Step (j), can also be implemented for providing an additional in-use warning signal of low cranking strength of the battery to the combustion engine operator, following engine turn-off, by also optionally including following engine turn-off warning sub-circuit 40.

Accordingly, in this configuration of the first preferred embodiment of the present invention, device 10, optionally including counter/reset sub-circuit 70, and also optionally including following engine turn-off warning sub-circuit 40, as shown in FIG. 1, by inclusion of both the lower and upper dashed line enclosures, respectively, features above described components: (a) reference voltage 12, (b) comparator 14, (c) integrator 16, (d) detector 18, (e) alarm 20, and further includes additional components: (f) one shot 72, (g) counter 74, (h) counter reset mechanism X75X associated with counter 74, (i) reset signal detector 76, (j) reset delay 78, (k) reset logic circuit 80, (l) at least one engine characteristic sensor 42 selected from the group consisting of engine noise sensors and engine vibration sensors, operatively connected, to the combustion engine and/or to the vehicle or device, for sensing at least one engine characteristic selected from the group consisting of engine noise and engine vibration, (m) at least one engine characteristic level tester 44 selected from the group consisting of engine noise level testers and engine vibration level testers, operatively connected, to the at least one engine characteristic sensor 42 via circuit junction 50, so as to measure the at least one engine characteristic of engine noise and/or engine vibration, and to compare the measurement to a corresponding pre-determined threshold level of the at least one engine characteristic of engine noise and/or engine vibration, for distinguishing between engine activation and engine non-activation, where engine non-activation includes engine turn-off, (n) a logic circuit 46 operatively connected, to the at least one engine characteristic level tester 44 via circuit junction 52 and to alarm 20 via circuit junction 54, for performing at least one 'AND' logic operation on a first signal received from engine characteristic level tester 44 and on a delayed second signal received from counter 74, such that logic circuit 46 upon completing the correct 'AND' logic operation activates alarm 20 for providing an 'additional' in-use warning signal of low cranking strength of the battery, following engine turn-off, and (o) a delay mechanism 48 operatively connected, to counter 74 via circuit junction 84, and to logic circuit 46 via circuit junction 58, for effecting the delay of the delayed second signal sent from counter 74 to logic circuit 46 so as to effect activation of alarm 20, for providing the additional in-use warning signal of low cranking strength of the battery, following engine turn-off. In this configuration, device 10 also includes electrical or electronic circuit junctions 82, 84, 86, 88, and 94, and, electrical or electronic signal paths 90 and 92.

As an extension of above described scenario (2), where the battery exhibits low, or less than normal, cranking strength during engine starting, alarm 20, in device 10 including optional following engine turn-off sub-circuit 40, provides a first in-use warning signal of low cranking strength of the battery to the engine operator, during, or following, engine starting, when the output signal of counter 74 is '1', and activates an additional time when engine characteristic level tester 44 registers an engine characteristic of engine noise and/or engine vibration less than a threshold level corresponding to engine turn-off, so as to provide the engine operator an additional in-use warning signal of low cranking strength of the battery, following engine turn-off, regardless of whether the first in-use warning signal of low cranking strength of the battery was activated, heard, or noticed by the engine operator.

Accordingly, the first preferred embodiment of the method of the present invention, optionally including counter/reset sub-circuit 70, and also optionally including following engine turn-off warning sub-circuit 40, as shown in FIG. 1, features above described Steps (a) through (j), and further includes the following Steps (k) through (n):

In Step (k), there is sensing at least one engine characteristic selected from the group consisting of engine noise and engine vibration, by at least one engine characteristic sensor 42.

In Step (l), there is measuring the at least one engine characteristic of the engine and comparing the at least one engine characteristic to at least one corresponding pre-determined threshold level of the engine characteristic for distinguishing between engine activation and engine non-activation, the engine non-activation including engine turn-off. This step features operation of at least one engine characteristic level tester 44.

In Step (m), there is performing at least one 'AND' logic operation on a first signal corresponding to the at least one engine characteristic and on a delayed second signal sent from counter 74 corresponding to the cranking strength of the battery being below the pre-determined value, PDV-D, of detector 18. This step features operation of logic circuit 46 and delay mechanism 48. It is noted that for implementing this configuration of the first preferred embodiment of the invention, delay mechanism 48 delays the output signal of counter 74, representing a more selective control of responding to the output signal of detector 18, instead of directly delaying the output signal of detector 18, as the case is according to above described Step (h) in the configuration and operation of device 10 without optionally including counter/reset sub-circuit 70.

In Step (n), there is upon completing a particular 'AND' logic operation, activating alarm 20 for providing an additional in-use warning signal of low cranking strength of the battery, following engine turn-off. As described above, this additional in-use warning signal of low cranking strength of the battery may be any combination of a, once occurring or automatically recurring, audible signal, visual signal, and, electromagnetic signal, generated internal and/or external to the vehicle or device powered by the combustion engine.

Steps, components, and operation of the second preferred embodiment of the method and device of the present invention are herein further described. FIG. 2 is a block diagram illustrating the second preferred embodiment of the device of the present invention, generally designated 15, constructed and operative for in-use detecting of low cranking strength of a combustion engine battery during engine starting, in accordance with the following disclosed method.

The second preferred embodiment of the present invention for in-use detecting low cranking strength of a combustion engine battery during engine starting, illustrated in FIG. 2, is based on integrating analog values of changes in battery voltage relative to constant reference voltage 12, without first comparing the relative voltage changes by comparator 14 (device 10 in FIG. 1) during engine starting. Optional features in the second preferred embodiment, also shown in FIG. 2, indicated by the upper and lower dashed line enclosures, are the addition of following engine turn-off warning sub-circuit 40, and/or the addition of counter/reset sub-circuit 70, respectively, as described above for the first preferred embodiment of the present invention.

The second preferred embodiment of the present invention is different from the first preferred embodiment, in that here, integrator 16 integrates analog values of voltage differences varying with time, instead of integrating digital logic values, for example, '0' or '1', provided by comparator 14 (device 10 in FIG. 1), with time. Except for the particular differences relating to the absence of comparator 14, and relating to integrating analog signal data by integrator 16, components and basic operation of device 15 of FIG. 2, corresponding to the second preferred embodiment of the present invention are the same as the components and basic operation of device 10 of FIG. 1, corresponding to the first preferred embodiment of the present invention.

Device 15 (without reference to optional features of following engine turn-off warning sub-circuit 40, and counter/reset sub-circuit 70) features components: (a) reference voltage 12, (b) integrator 16, (c) detector 18, and (d) alarm 20. Device 15 also includes electrical or electronic circuit junctions 23, 26, and 28, and, electrical or electronic signal path 34.

In Step (a) of the second preferred embodiment of the method, there is sensing the time varying voltage of the battery by integrator 16, from initiation of, and during, engine starting, as a result of an operator turning an ignition key or depressing an ignition button of the vehicle or device for activating the starter mechanism and initiating cranking of the motor crankshaft.

Integrator 16 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, BV, is continuously or discontinuously sensed by integrator 16 from initiation of, and during, engine starting.

In Step (b), there is evaluating the time varying difference between the time varying battery voltage, BV, and constant reference DC voltage 12, RV, by integrator 16, for forming a plurality of evaluated voltage differences, from initiation of, and during, engine starting, including during the initial cranking of the engine crankshaft.

Reference voltage 12 is supplied by a device or a component, preferably set prior to or at the time of installation of device 15 in the combustion engine, and is continuously or discontinuously sent to integrator 16 via circuit junction 23. Reference voltage, RV, is set at a value corresponding to less than normal, but, sufficient, cranking strength of the battery required for activating and initiating turning of the crankshaft during engine starting, according to specifications, characteristics, and operating behavior, of the starter mechanism of the particular combustion engine and/ or according to requirements of the particular application of the vehicle or device powered by the combustion engine.

For simplicity of, without limiting, describing the second preferred embodiment of the present invention including no comparator in device 15, integrator 16 evaluates the difference between the battery voltage, BV, and constant reference DC voltage, RV, in a form written as (RV−BV), instead of as (BV−RV) according to the previously described first preferred embodiment of the present invention, including a comparator. Accordingly, for battery voltage, BV, larger than reference voltage, RV, evaluation of (RV−BV) is negative, a likely, but not definitive, indication of normal cranking strength of the battery. In contrast, for battery voltage, BV, equal to or less than reference voltage, RV, evaluation of (RV−BV) becomes equal to zero or positive, respectively, a likely, but not definitive, indication of low, or less than normal, cranking strength of the battery.

Prior to activation and initial turning of the crankshaft and engine starting, the electro-mechanical starting load of the starter mechanism is relatively low, such that (RV−BV) is normally negative. During and immediately following activation and initial turning of the crankshaft via the cranking strength of the battery, in the relatively short initial time interval of engine starting, typically of the order of one second, the electromechanical load significantly increases, along with a corresponding significant and sharp drop in battery voltage, such that (RV−BV) normally becomes positive with time, at least until the time when the engine generator or alternator starts operating for charging the battery. As for the first preferred embodiment described above, two generally applicable scenarios of battery behavior are described with respect to implementation and operation of the present invention.

In scenario (1), where the battery exhibits normal cranking strength during engine starting, following the initial time interval of engine starting during which (RV−BV) normally becomes positive due to the starting load, (RV−BV) is normally negative. However, during the complete, not just initial, time interval of engine starting, normally occurring random and/or periodic electromechanical noise and vibrations associated with the engine starting, cause random and/or periodic spikes or variations in the battery voltage, BV, resulting in random and/or periodic changes in (RV−BV), including occurrences of (RV−BV) becoming equal to zero or positive, erroneously representing preliminary indication of low, or less than normal, cranking strength of the battery, immediately followed by changing back to being negative following the end of each such voltage spike or variation.

In scenario (2), where the battery exhibits low, or less than normal, cranking strength during engine starting, following the initial time interval of engine starting during which (RV−BV) is normally positive due to the starting load, (RV−BV) remains positive or may become zero. However, during the complete, not just initial, time interval of engine starting, normally occurring random and/or periodic electromechanical noise and vibrations associated with the engine starting, cause random and/or periodic spikes or variations in the battery voltage, BV, resulting in random and/or periodic changes in (RV−BV), including occurrences of (RV−BV) being negative, erroneously representing preliminary indication of normal cranking strength of the battery, immediately followed by changing back to being positive or zero following the end of each such voltage spike or variation.

In each scenario (1) or (2), immediately following the complete time interval of engine starting, when the engine generator or alternator starts operating for charging the battery, battery voltage, BV, normally increases until reaching a steady-state range, whereby (RV−BV) normally remains negative during continued operation of the engine. By the time this occurs, the main measuring, decision making, and action, steps of the presently disclosed method are complete, whereby, according to scenario (1) or (2) and the below described steps, alarm 20 either remains inactive, or, is to be activated, respectively, for providing an in-use warning signal of low cranking strength of the battery to the combustion engine operator, during, or following, engine starting, prior to engine turn-off.

In Step (c), there is integrating the evaluated differences between the battery voltage, BV, and constant reference DC voltage 12, RV, by integrator 16, during engine starting.

Integrator 16 continuously or discontinuously integrates a stream or plurality of analog values of (RV−BV) varying in time. During the above described engine starting, the majority of the plurality of values of (RV−BV) generated according to scenario (1) or (2) is either negative, or, positive or zero. Accordingly, the output signal of integrator 16 is a negative, or, positive or zero, analog value, respectively.

Integrator 16 takes into account, by integrating over, all the random and/or periodic spikes or variations in the battery voltage, BV, and therefore, all the random and/or periodic changes in (RV−BV), including occurrences of (RV−BV) being unexpectedly zero or positive, or, negative, according to scenario (1) or (2), respectively, immediately followed by changing back to being negative, or, positive or zero, respectively, following the end of each voltage spike or variation, during engine starting. By including integrator 16 in the circuit of device 15, the potentially erroneous affects of voltage spikes or variations on accurately and reproducibly determining the condition of low cranking strength of the battery during engine starting are at least minimized, if not entirely eliminated.

In Step (d) there is determining and responding to the output signal of integrator 16, by detector 18, during engine starting.

The output signal of integrator 16 is continuously or discontinuously sent to detector 18 via circuit junction 26. Detector 18 determines if the value of the integrator output signal is less than, or, equal to or greater than, a pre-determined value of detector 18, hereinafter, also referred to as PDV-D. According to the result of this decision making step, the responsive output signal of detector 18 is a digital, preferably, logic value, '0' or '1', respectively.

Pre-determined value of detector 18, PDV-D, is preferably, but not limited to being, set at a positive value, representing a larger than normal decrease in battery voltage during engine starting, corresponding to less than normal, but, still sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

In scenario (1), where the battery exhibits normal cranking strength during engine starting, (RV–BV) is usually negative (however, as described above in Step (b), there are positive contributions of (RV–BV) due to normally occurring random and/or periodic electromechanical noise and vibrations associated with the engine starting, causing random and/or periodic negative spikes or variations in the battery voltage, BV), translating to an integrator output signal being negative. In this scenario, the integrator output signal is less than the pre-determined value, PDV-D, whereby the output signal of detector 18 is assigned the value '0'.

In scenario (2), where the battery exhibits low, or less than normal, cranking strength during engine starting, (RV–BV) is usually positive or zero (however, as described above in Step (b), there are negative contributions of (RV–BV) due to normally occurring random and/or periodic electromechanical noise and vibrations associated with the engine starting, causing random and/or periodic positive spikes or variations in the battery voltage, BV), translating to an integrator output signal being positive or zero. In this scenario, the integrator output signal is greater than or equal to the pre-determined value, PDV-D, whereby the output signal of detector 18 is assigned the value '1'.

In Step (e) there is determining and responding to the output signal of detector 18, by alarm 20, during, or following, engine starting, prior to engine turn-off.

The output signal of detector 18 is continuously or discontinuously sent to alarm 20 via circuit junction 28, along signal path 34. Alarm 20 determines if the value of the detector output signal is '0' or '1', and responds by either remaining inactive, or, activating, respectively, for providing an in-use warning signal of low cranking strength of the battery to the combustion engine operator, during, or following, the above described time interval of engine starting, prior to engine turn-off.

In scenario (1), where the battery exhibits normal cranking strength during engine starting, the output signal of detector 18 is '0', whereby alarm 20 responds by remaining inactive, providing no in-use warning signal of low cranking strength of the battery, during, or following, engine starting.

In scenario (2), where the battery exhibits low, or less than normal, cranking strength during engine starting, the output signal of detector 18 is '1', whereby alarm 20 responds by activating for providing an in-use warning signal of low cranking strength of the battery to the combustion engine operator, during, or following, the above described time interval of engine starting, prior to engine turn-off. The in-use warning signal of low cranking strength of the battery may be any combination of a, once occurring or automatically recurring, audible signal, visual signal, and, electromagnetic signal, generated internal and/or external to the vehicle or device powered by the combustion engine.

Some specific examples of warning signals are an audible signal sounding inside the operator compartment of the vehicle or device, a visual signal appearing on the dashboard display, on the inside rear-view mirror, and/or on the front windshield, inside the operator compartment of the vehicle or device, and, an electromagnetic signal, such as a wireless warning signal generated and/or received either internal or external to the operator compartment of the vehicle or device. Thus, assuming the engine operator notices, or is made aware of, the in-use warning signal of low cranking strength of the battery, the operator can plan to either recharge or replace the battery prior to the battery having insufficient cranking strength for activating the starter mechanism and initiating the turning of the crankshaft, thereby failing to enable starting the engine.

The second preferred embodiment of the present invention (FIG. 2), can also be implemented for providing an additional in-use warning signal of low cranking strength of the battery to the combustion engine operator, following engine turn-off, by optionally including following engine turn-off warning sub-circuit 40, indicated by the upper dashed line enclosure in FIG. 2. In the second preferred embodiment of the present invention, following engine turn-off sub-circuit 40 is configured and operates similarly to following engine turn-off sub-circuit 40 optionally added in the first preferred embodiment of the present invention (FIG. 1).

Accordingly, in the second preferred embodiment of the present invention, device 15 optionally including following engine turn-off warning sub-circuit 40 (FIG. 2, without reference to optional counter/reset sub-circuit 70 indicated by the lower dashed line enclosure) features above described components: (a) reference voltage 12, (b) integrator 16, (c) detector 18, (d) alarm 20, and further includes additional components: (e) at least one engine characteristic sensor 42 selected from the group consisting of engine noise sensors and engine vibration sensors, operatively connected, to the combustion engine and/or to the vehicle or device, for sensing at least one engine characteristic selected from the group consisting of engine noise and engine vibration, (f) at least one engine characteristic level tester 44 selected from the group consisting of engine noise level testers and engine vibration level testers, operatively connected, to the at least one engine characteristic sensor 42 via circuit junction 50, so as to measure the at least one engine characteristic of engine noise and/or engine vibration, and to compare the measurement to a corresponding pre-determined threshold level of the at least one engine characteristic of engine noise and/or engine vibration, for distinguishing between engine activation and engine non-activation, where engine non-activation includes engine turn-off, (g) a logic circuit 46 operatively connected, to the at least one engine characteristic level tester 44 via circuit junction 52 and to alarm 20 via circuit junction 54, for performing at least one 'AND' logic operation on a first signal received from engine characteristic level tester 44 and on a delayed second signal received from detector 18, such that logic circuit 46 upon completing the correct 'AND' logic operation activates alarm 20 for providing an 'additional' in-use warning signal of low cranking strength of the battery, following engine turn-off, and (h) a delay mechanism 48 operatively connected, to detector 18 via circuit junction 56 and signal path 34, and to logic circuit 46 via circuit junction 58, for effecting the delay of the delayed second signal sent from detector 18 to logic circuit 46 so as to effect activation of alarm 20, for providing the additional in-use warning signal of low cranking strength of the battery, following engine turn-off.

As an extension of above described scenario (2), where the battery exhibits low, or less than normal, cranking strength during engine starting, alarm 20, in device 15 including optional following engine turn-off sub-circuit 40, provides a first in-use warning signal of low cranking strength of the battery to the engine operator, during, or following, engine starting, when the output signal of detector 18 is '1', and activates an additional time when engine characteristic level tester 44 registers an engine characteristic of engine noise and/or engine vibration less than a threshold level corresponding to engine turn-off, so as to provide the engine operator an additional in-use warning signal of low cranking strength of the battery, following engine turn-off, regardless of whether the first in-use warning signal of low cranking strength of the battery was activated, heard, or noticed by the engine operator.

Accordingly, the second preferred embodiment of the method of the present invention, optionally including following engine turn-off warning sub-circuit 40, as shown in FIG. 2, features immediately preceding described Steps (a) through (e), and further includes the following Steps (f) through (i):

In Step (f), there is sensing at least one engine characteristic selected from the group consisting of engine noise and engine vibration, by at least one engine characteristic sensor 42.

In Step (g), there is measuring the at least one engine characteristic of the engine and comparing the at least one engine characteristic to at least one corresponding pre-determined threshold level of the engine characteristic for distinguishing between engine activation and engine non-activation, the engine non-activation including engine turn-off. This step features operation of at least one engine characteristic level tester 44.

In Step (h), there is performing at least one 'AND' logic operation on a first signal corresponding to the at least one engine characteristic and on a delayed second signal sent from detector 18 corresponding to the cranking strength of the battery being below the pre-determined value, PDV-D, of detector 18. This step features operation of logic circuit 46 and delay mechanism 48.

In Step (i), there is upon completing a particular 'AND' logic operation, activating alarm 20 for providing an additional in-use warning signal of low cranking strength of the battery, following engine turn-off. This additional in-use warning signal of low cranking strength of the battery may be any combination of a, once occurring or automatically recurring, audible signal, visual signal, and, electromagnetic signal, generated internal and/or external to the vehicle or device powered by the combustion engine.

Another optional feature of the second preferred embodiment of the present invention is the addition of steps and components enabling counting individual events of detecting the development of low cranking strength of the battery, during engine starting. Implementation of this optional feature is accomplished by the addition of counter/reset sub-circuit 70, to device 15, as shown in FIG. 2, indicated by the lower dashed line enclosure. The advantage of including this optional feature in the invention is for enabling additional control of providing the warning signal to the engine operator, during the step (Step (e) above) of determining and responding to the output signal of detector 18, by alarm 20, during, or following, engine starting, prior to engine turn-off. In the second preferred embodiment of the present invention, counter/reset sub-circuit 70 is configured and operates the same as counter/reset sub-circuit 70 optionally added in the first preferred embodiment of the present invention (FIG. 1).

Accordingly, the second preferred embodiment of the present invention, device 15 optionally including counter/reset sub-circuit 70 (FIG. 2, without reference to optional following engine turn-off sub-circuit 40 indicated by the upper dashed line enclosure) features above described components: (a) reference voltage 12, (b) integrator 16, (c) detector 18, (d) alarm 20, and further includes additional components: (e) a one shot 72, (f) a counter 74, (g) a counter reset mechanism 75 associated with counter 74, (h) a reset signal detector 76, (i) a reset delay 78, and (j) a reset logic circuit 80. Here, device 15 also includes electrical or electronic circuit junctions 82, 84, 86, 88, and 94, and, electrical or electronic signal paths 90 and 92.

Accordingly, the second preferred embodiment of the method of the present invention, optionally including counter/reset sub-circuit 70 (FIG. 2, without reference to optional following engine turn-off sub-circuit 40), features immediately preceding described Steps (a) through (d), and further includes the following Steps (e) through (j):

In Step (e) there is determining and responding to a change in the output signal of detector 18, by one shot 72, during engine starting.

One shot 72, being a commonly known 'mono-stable' electronic component, normally provides a single or mono-stable digital output signal, preferably, a logic value, '0' or '1'. The output signal of detector 18 is continuously or discontinuously sent to one shot 72 via circuit junction 28. During engine starting, one shot 72 determines if there is a change in the output signal of detector 18, for example, from '0' to '1', and responds accordingly by changing the output signal of one shot 72, for example, from '0' to '1', respectively, for an 'unstable', or pre-determined, time interval, hereinafter referred to as T[one shot].

In scenario (1), where the battery exhibits normal cranking strength during engine starting, the output signal of detector 18 is '0', whereby one shot 72 responds by remaining in its mono-stable state with an output signal of '0'.

In scenario (2), where the battery exhibits low, or less than normal, cranking strength during engine starting, the output signal of detector 18 changes from '0' to '1', whereby one shot 72 determines this change, and responds accordingly by changing the output signal of one shot 72 from '0' to '1', for the duration of the pre-determined time interval, T[one shot], even if during T[one shot] the output signal of detector 18 changes back from '1' to '0'.

In Step (f) there is determining and responding to the output signal of one shot 72, by counter 74, during engine starting.

The output signal of one shot 72 is continuously or discontinuously sent to counter 74 via circuit junction 82. Counter 74 is for maintaining a cumulative or incremental count number of each occurrence device 10 determines that the battery exhibits low, or less than normal, cranking strength during engine starting. An internal mechanism (not shown) of counter 74 counts the number of occurrences of low cranking strength of the battery in an analog mode, for example, 0, 1, 2, 3, 4, 5, . . . , but provides a digital, preferably, logic value, '0' or '1', output signal to alarm 20. When counter 74 registers or determines a count number of occurrences of low, or less than normal, cranking strength of the battery, equal to a pre-determined count number, hereinafter, also referred to as PDCN-C, for example, 0, or, 1, or, 2, or, 3, or, 4, or, 5, counter 74 sends an output signal via circuit junction 84 for activating alarm 20.

In scenario (1), where the battery exhibits normal cranking strength during engine starting, detector 18 determines the value of the output signal of integrator 16 to be less than the pre-determined value of detector 18, PDV-D, such the output signal of detector 18 is '0', and the output signal of one shot 72 remains at '0', according to scenario (1), described above in Steps (d)–(e). Accordingly, counter 74 responds by not incrementing its current count number of occurrences of low cranking strength of the battery, continuing to register a count number of occurrences of low, or less than normal, cranking strength of the battery less than PDCN-C, and provides an output signal of '0' via circuit junction 84 to alarm 20.

In scenario (2), where the battery exhibits low, or less than normal, cranking strength during engine starting, detector 18 determines the value of the output signal of integrator 16 to be equal to or greater than the pre-determined value of detector 18, PDV-D, such that the output signal of detector 18 changes from '0' to '1', and the output signal of one shot 72 changes from '0' to '1' for the pre-determined time interval, T[one shot], according to scenario (2), described above in Steps (d)–(e). Accordingly, counter 74 responds by incrementing its count number of occurrences of low cranking strength of the battery. When counter 74 registers a count number equal to PDN-C, counter 74 sends an output signal of '1' via circuit junction 84 for activating alarm 20, whereby alarm 20 responds by providing an in-use warning signal of low cranking strength of the battery to the combustion engine operator, during, or following, engine starting, prior to engine urn-off.

In scenario (2), the output signal of one shot 72 remains at '1' for the pre-determined time interval, T[one shot], in order to prevent activation of counter reset mechanism X75X associated with counter 74, for resetting counter 74, according to the appropriate output signal sent by reset logic circuit 80, as described below in Step (g) through Step (i).

In Step (g) there is determining and responding to the output signal of integrator 16, by reset signal detector 76, during engine starting, substantially simultaneous to above described Step (d) of determining and responding to the output signal of integrator 16, by detector 18, during engine starting.

The output signal of integrator 16 is continuously or discontinuously sent to reset signal detector 76 via circuit junction 26, along signal path 90. Reset signal detector 76 determines if the output signal of integrator 16 is less than, or, equal to or greater than, a pre-determined value of reset signal detector 76, hereinafter, also referred to as PDV-RS. According to the result of this decision making step, the responsive output signal of reset signal detector 76 is a digital, preferably, logic value, '0' or '1', respectively.

Pre-determined value of reset signal detector 76, PDV-RS, is set at a value representing a normally occurring large decrease in battery voltage during engine starting, corresponding to normal cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine. The magnitude of PDV-RS of reset signal detector 76 is set less than the magnitude of the pre-determined value of detector 18, PDV-D, since, as previously described above in Step (d), pre-determined value of detector 18, PDV-D, is set at a value representing a larger than normal decrease in battery voltage during engine starting, corresponding to less than normal, but, still sufficient, cranking strength of the battery required for activating and initiating turning of the crankshaft during engine starting.

Accordingly, the responsive output signal of reset signal detector 76 changes from '0' to '1' during each scenario of engine starting, including scenario (1) where the battery exhibits normal cranking strength during engine starting, or, scenario (2) where the battery exhibits low, or less than normal, cranking strength during engine starting. As such, reset signal detector 76 serves as an engine starting indicator, activating upon any significant decrease in battery voltage corresponding to engine starting, in general, and to activation and initiation of cranking of the crankshaft, in particular.

In Step (h) there is delaying the forwarding of the output signal of reset signal detector 76, by reset delay 78, during engine starting.

The output signal of reset signal detector 76 is continuously or discontinuously sent to reset delay 78 via circuit junction 86. In scenario (2), during the time interval of engine starting with low cranking strength of the battery, as a consequence of PDV-RS of reset signal detector 76 being set less than PDV-D of detector 18, the output signal of reset signal detector 76 changes in time from '0' to '1' before the output signal of detector 18 changes from '0' to '1'.

In this particular exemplary configuration of the second preferred embodiment of the present invention, optionally including counter/reset sub-circuit 70, the objective of including reset delay 78 in device 15 is for delaying the forwarding of the output signal of reset signal detector 76, for a pre-determined time interval, hereinafter, also referred to as T[reset delay], until integrator 16 completes its function according to above described Step (c) of integrating the evaluated differences between the battery voltage, BV, and constant reference DC voltage 12, RV, during engine starting, and also until one shot 72 completes its function according to above described Step (e) of determining and responding to a change in the output signal of detector 18 during engine starting. The pre-determined time interval, T[reset delay], of reset delay 78, is typically set at a value, for example, a fraction of a second, which is significantly less than the value, for example, one second, of the pre-determined time interval, T[one shot], of one shot 72, for properly enabling completion of Step (c) through Step (e).

In Step (i) there is analyzing and responding to the substantially simultaneous reception of the output signal of one shot 72 and the output signal of reset delay 78 by reset logic circuit 80, during, or, following, engine starting, prior to engine turn-off.

The output signal of one shot 72 is continuously or discontinuously sent to reset logic circuit 80 via circuit junction 82, along signal path 92, while the output signal of reset delay 78 is continuously or discontinuously sent to reset logic circuit 80 via circuit junction 88. Reset logic circuit 80 performs a logic operation on the values of these input signals, and determines if there is to be a resetting of counter 74. According to the result of this decision making step, the responsive output signal of reset logic circuit 80 is a digital, preferably, logic value, '1' or '0', according to scenario (1) where the battery exhibits normal cranking strength during engine starting, or, scenario (2) where the battery exhibits low, or less than normal, cranking strength during engine starting, respectively.

Reset logic circuit 80 operates according to three sub-steps, as follows:

In sub-step (1) of Step (i), reset logic circuit 80 inverts the received output signal of one shot 72, for example, digital logic value '0' or '1', for forming an inverted output signal of one shot 72, for example, digital logic value '1' or '0', respectively, according to above described scenario (1), or, scenario (2), respectively.

In sub-step (2) of Step (i), reset logic circuit 80 performs an 'AND' logic operation on both the value of the inverted output signal of one shot 72, '1' or '0', of sub-step (1), and on the value of the output signal of reset delay 78, '1'. As described above in Step (g), the output signal of reset signal detector 76 always changes from '0' to '1' during each above described scenario (1) or (2) of engine starting, whereby during engine starting, the value of the output signal of reset delay 78 always changes from '0' to '1'. Accordingly, the result of the 'AND' logic operation is either '1' 'AND' '1', or, '0' 'AND' '1', according to above described scenario (1), or, scenario (2), respectively.

In sub-step (3) of Step (i), reset logic circuit 80 responds to the result of the 'AND' logic operation of sub-step (2), by sending a corresponding output signal, '1' or '0', according to above described scenario (1), or, scenario (2), respectively, to counter 74 via circuit junction 94, whereby counter reset mechanism X75X associated with counter 74 responds by either activating, or, remaining inactive, for resetting counter 74.

In Step (j) there is determining and responding to the output signal of counter 74, by alarm 20, during, or, following, the engine starting, prior to engine turn-off.

The output signal of counter 74 is continuously or discontinuously sent to alarm 20 via circuit junction 84. As described above in Step (f), the output signal of counter 74 is a digital, preferably, logic value, '0' or '1', according to scenario (1), or, scenario (2), respectively.

In scenario (1), where the battery exhibits normal cranking strength during engine starting, counter 74 determines that the registered count number, for example, 0, or, 1, or, 2, or, 3, or, 4, of occurrences of low cranking strength of the battery is less than PDCN-C, for example, 5, and sends an output signal of '0' via circuit junction 84 to alarm 20, whereby alarm 20 responds by remaining inactive, providing no in-use warning signal of low cranking strength of the battery, during, or following, engine starting.

In scenario (2), where the battery exhibits low, or less than normal, cranking strength during engine starting, counter 74 determines that the registered count number, for example, 5, of occurrences of low cranking strength of the battery of is equal to PDCN-C, and sends an output signal of '1' via circuit junction 84 to alarm 20, whereby alarm 20 responds by providing an in-use warning signal of low cranking strength of the battery to the combustion engine operator, during, or following, engine starting, prior to engine turn-off.

A summary of the sequence of events relating to operation of optional counter/reset circuit 70 in the first preferred embodiment of the present invention is as follows:

In scenario (1), where the battery exhibits normal cranking strength during engine starting, the output signal of detector 18 is '0', such that the output signal of one shot 72 remains at '0', causing no incremental increase in the count number of counter 74, whereby counter 74 determines that the count number, for example, 0, or, 1, or, 2, or, 3, or, 4, of occurrences of low cranking strength of the battery is less than PDCN-C, for example, 5, while the output signal of reset signal detector 76 and of reset delay 78 each change from '0' to '1'. Reset logic circuit 80 inverts the received output signal of one shot 72 from '0' to '1', and performs the 'AND' logic operation on these input signal values of '1' 'AND' '1', resulting in an output signal of '1' being sent to counter 74, whereby counter reset mechanism X75X associated with counter 74 responds by resetting the current count number of, for example, 0, or, 1, or, 2, or, 3, or, 4, to zero, followed by counter 74 sending an output signal of '0' to alarm 20, whereby alarm 20 responds by remaining inactive, providing no in-use warning signal of low cranking strength of the battery, during, or following, engine starting.

In scenario (2), where the battery exhibits low, or less than normal, cranking strength during engine starting, the output signal of detector 18 changes from '0' to '1', such that the output signal of one shot 72 changes from '0' to '1', causing an incremental increase in the count number of counter 74, for example, from 0 to 1, or, from 1 to 2, or, from 2 to 3, or, from 3 to 4, or, from 4 to 5, whereby counter 74 determines that the new count number, for example, 5, of occurrences of low cranking strength of the battery is equal to PDCN-C, for example, 5, while the output signal of reset signal detector 76 and of reset delay 78 each change from '0' to '1'. Reset logic circuit 80 inverts the received output signal of one shot 72 from '1' to '0', and performs the 'AND' logic operation on these input signal values of '0' 'AND' '1', resulting in an output signal of '0' being sent to counter 74, whereby counter reset mechanism X75X associated with counter 74 responds by not resetting the new count number of, for example, 5, to zero, followed by counter 74 sending an output signal of '1' to alarm 20, whereby alarm 20 responds by providing an in-use warning signal of low cranking strength of the battery to the combustion engine operator, during, or following, engine starting, prior to engine turn-off.

The second preferred embodiment of the present invention (FIG. 2), optionally including the additional control during the step (Step (e) above) of determining and responding to the output signal of detector 18, by alarm 20, during, or following, engine starting, including components and operation of optional counter/reset sub-circuit 70, as just described above in Step (a) through Step (j), can also be implemented for providing an additional in-use warning signal of low cranking strength of the battery to the combustion engine operator, following engine turn-off, by also optionally including following engine turn-off warning sub-circuit 40.

Accordingly, in this configuration of the second preferred embodiment of the present invention, device 15, optionally including counter/reset sub-circuit 70, and also optionally including following engine turn-off warning sub-circuit 40, as shown in FIG. 2, by inclusion of both the lower and upper dashed line enclosures, respectively, features above described components: (a) reference voltage X12X, (b) integrator 16, (c) detector 18, (d) alarm 20, and further includes additional components: (e) one shot 72, (f) counter 74, (g) counter reset mechanism X75X associated with counter 74, (h) reset signal detector 76, (i) reset delay 78, (j) reset logic circuit 80, (k) at least one engine characteristic sensor 42 selected from the group consisting of engine noise sensors and engine vibration sensors, operatively connected, to the combustion engine and/or to the vehicle or device, for sensing at least one engine characteristic selected from the group consisting of engine noise and engine vibration, (1) at least one engine characteristic level tester 44 selected from the group consisting of engine noise level testers and engine vibration level testers, operatively connected, to the at least one engine characteristic sensor 42 via circuit junction 50, so as to measure the at least one engine characteristic of engine noise and/or engine vibration, and to compare the measurement to a corresponding predetermined threshold level of the at least one engine characteristic of engine noise and/or engine vibration, for distinguishing between engine activation and engine non-activation, where engine non-activation includes engine turn-off, (m) a logic circuit 46 operatively connected, to the at least one engine characteristic level tester 44 via circuit junction 52 and to alarm 20 via circuit junction 54, for performing at least one 'AND' logic operation on a first signal received from engine characteristic level tester 44 and on a delayed second signal received from counter 74, such that logic circuit 46 upon completing the correct 'AND' logic operation activates alarm 20 for providing an 'additional' in-use warning signal of low cranking strength of the battery, following engine turn-off, and (n) a delay mechanism 48 operatively connected, to counter 74 via circuit junction 84, and to logic circuit 46 via circuit junction 58, for effecting the delay of the delayed second signal sent from counter 74 to logic circuit 46 so as to effect activation of alarm 20, for providing the additional in-use warning signal of low cranking strength of the battery, following engine turn-off. In this configuration, device 15 also includes electrical or electronic circuit junctions 82, 84, 86, 88, and 94, and, electrical or electronic signal paths 90 and 92.

As an extension of above described scenario (2), where the battery exhibits low, or less than normal, cranking strength during engine starting, alarm 20, in device 15 optionally including counter/reset sub-circuit 70, and also optionally including following engine turn-off warning sub-circuit 40, provides a first in-use warning signal of low cranking strength of the battery to the engine operator, during, or following, engine starting, when the output signal of counter 74 is '1', and activates an additional time when engine characteristic level tester 44 registers an engine characteristic of engine noise and/or vibration less than a threshold level corresponding to engine turn-off, so as to provide the engine operator an additional in-use warning signal of low cranking strength of the battery, following engine turn-off, regardless of whether the first in-use warning signal of low cranking strength of the battery was activated, heard, or noticed by the engine operator.

Accordingly, the second preferred embodiment of the method of the present invention, optionally including counter/reset sub-circuit 70, and also optionally including following engine turn-off warning sub-circuit 40, as shown in FIG. 2, features immediately preceding described Steps (a) through (j), and further includes the following Steps (k) through (n):

In Step (k), there is sensing at least one engine characteristic selected from the group consisting of engine noise and engine vibration, by at least one engine characteristic sensor 42.

In Step (l), there is measuring the at least one engine characteristic of the engine and comparing the at least one engine characteristic to at least one corresponding predetermined threshold level of the engine characteristic for distinguishing between engine activation and engine non-activation, the engine non-activation including engine turn-off. This step features operation of at least one engine characteristic level tester 44.

In Step (m), there is performing at least one 'AND' logic operation on a first signal corresponding to the at least one engine characteristic and on a delayed second signal sent from counter 74 corresponding to the cranking strength of the battery being below the pre-determined value, PDV-D, of detector 18. This step features operation of logic circuit 46 and delay mechanism 48. It is noted that for implementing this configuration of the second preferred embodiment of the invention, delay mechanism 48 delays the output signal of counter 74, representing a more selective control of responding to the output signal of detector 18, instead of directly delaying the output signal of detector 18, as the case is according to above described Step (h) in the configuration and operation of device 15 without optionally including counter/reset sub-circuit 70.

In Step (n), there is upon completing a particular 'AND' logic operation, activating alarm 20 for providing an additional in-use warning signal of low cranking strength of the battery, following engine turn-off. As described above, this additional in-use warning signal of low cranking strength of the battery may be any combination of a, once occurring or automatically recurring, audible signal, visual signal, and, electromagnetic signal, generated internal and/or external to the vehicle or device powered by the combustion engine.

It is noted that any number of additional components and steps may be optionally added to any of the above described configurations of the method and device of the present invention, for either controlling temperature and/or for compensating effects due to temperature changes, during implementation of the present invention. For example, any number of temperature sensors, and corresponding steps for operation, may be added to any number of components featured in the first and second preferred embodiments of the present invention, device 10 of FIG. 1, and device 15 of FIG. 2, respectively.

While the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for in-use detecting low cranking strength of a combustion engine battery during engine starting, the engine starting featuring activation and initiation of cranking of the combustion engine crankshaft by energy supplied by the combustion engine battery, the method comprising the steps of:

(a) sensing time varying voltage of the battery by a comparator, from initiation of and during the engine starting;

(b) comparing said time varying voltage of the battery to a constant reference DC voltage by said comparator, for forming a plurality of output signals of said comparator, from said initiation of and during the engine starting;

(c) integrating said plurality of said output signals of said comparator by an integrator, for forming an output signal of said integrator, during the engine starting;

(d) determining and responding to said output signal of said integrator by a detector, for forming an output signal of said detector, during the engine starting;

(e) determining and responding to said output signal of said detector by an alarm, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;

(f) sensing at least one engine characteristic selected from the group consisting of engine noise and engine vibration, by at least one engine characteristic sensor;

(g) measuring said at least one engine characteristic of the engine and comparing said at least one engine characteristic to at least one corresponding pre-determined threshold level of said engine characteristic for distinguishing between engine activation and engine non-activation, said engine non-activation including engine turn-off;

(h) performing at least one 'AND' logic operation on a first signal corresponding to said at least one engine characteristic and on a delayed second signal sent from said detector corresponding to the low cranking strength of the battery; and (i) upon completing a particular 'AND' logic operation, activating said alarm for providing an additional in-use warning signal of the low cranking strength of the battery following engine turn-off.

2. The method of claim 1, whereby said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

3. The method of claim 1, whereby said sensing of said time varying voltage of the battery by said comparator is effected in a mode selected from the group consisting of continuously with time and discontinuously with time.

4. The method of claim 1, whereby said constant reference DC voltage is set at a value corresponding to less than normal but sufficient cranking strength of the battery required for the activation and initiation of cranking of the combustion engine crankshaft from said initiation of and during the engine starting.

5. The method of claim 1, whereby said output signals of said comparator are selected from the group consisting of digital and analog.

6. The method of claim 1, whereby step (d) further comprises the step of:

(i) determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

7. The method of claim 1, whereby said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

8. The method of claim 7, whereby said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

9. The method of claim 1, whereby the steps (a) through (e) further comprise steps selected from the group consisting of controlling temperature and compensating effects due to temperature changes, during implementation of the method.

10. A method for in-use detecting low cranking strength of a combustion engine battery during engine starting, the engine starting featuring activation and initiation of cranking of the combustion engine crankshaft by energy supplied by the combustion engine battery, the method comprising the steps of:

(a) sensing time varying voltage of the battery by a comparator, from initiation of and during the engine starting;

(b) comparing said time varying voltage of the battery to a constant reference DC voltage by said comparator, for forming a plurality of output signals of said comparator, from said initiation of and during the engine starting;

(c) integrating said plurality of said output signals of said comparator by an integrator, for forming an output signal of said integrator, during the engine starting;

(d) determining and responding to said output signal of said integrator by a detector, for forming an output signal of said detector, during the engine starting;

(e) determining and responding to said output signal of said detector by a one shot, for forming an output signal of said one shot, during the engine starting;

(f) determining and responding to said output signal of said one shot by a counter, whereupon according to said output signal of said one shot said counter registers a count number of occurrences of the low cranking strength of the battery, for forming an output signal of said counter, during the engine starting;

(g) determining and responding to said output signal of said integrator by a reset signal detector, for forming an output signal of said reset signal detector, substantially simultaneous to step (d) of said determining and said responding to said output signal of said integrator by said detector, during the engine starting;

(h) delaying forwarding of said output signal of said reset signal detector by a reset delay, during the engine starting;

(i) analyzing and responding to substantially simultaneous reception of said output signal of said one shot and said output signal of said reset delay by a reset logic circuit, for forming an output signal of said reset logic circuit, whereupon according to said output signal of said reset logic circuit sent to said counter, response of a counter reset mechanism associated with said counter is selected from the group consisting of activating for resetting said count number of said counter and remaining inactive by not resetting said count number of said counter, during the engine starting; and (j) determining and responding to said output signal of said counter by an alarm, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

11. The method of claim 10, whereby said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

12. The method of claim 10, whereby said sensing of said time varying voltage of the battery by said comparator is effected in a mode selected from the group consisting of continuously with time and discontinuously with time.

13. The method of claim 10, whereby said constant reference DC voltage is set at a value corresponding to less than normal but sufficient cranking strength of the battery required for the activation and initiation of cranking of the combustion engine crankshaft from said initiation of and during the engine starting.

14. The method of claim 10, whereby said output signals of said comparator are selected from the group consisting of digital and analog.

15. The method of claim 10, whereby step (d) further comprises the step of:

(i) determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

16. The method of claim 10 whereby step (g) further comprises the step of:

(i) determining a value of said output signal of said integrator selected from the group consisting of less than, and, equal to or greater than, a pre-determined value of said reset signal detector, said pre-determined value of said reset signal detector representing a normally large decrease in said voltage of the battery during the engine starting and corresponding to normal cranking strength of the battery during the engine starting.

17. The method of claim 10 whereby step (i) further comprises the steps of:

(i) inverting a digital value of said output signal of said one shot, for forming an inverted digital value of said output signal of said one shot, by said reset logic circuit;

(ii) performing an 'AND' logic operation on said inverted digital value of said output signal of said one shot and on a digital value of said output signal of said reset delay, by said reset logic circuit; and (iii) responding to a particular result of said 'AND' logic operation of step (ii) by said reset logic circuit sending a corresponding logic output signal to said counter.

18. The method of claim 10, whereby said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

19. The method of claim 18, whereby said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

20. The method of claim 10, whereby the steps (a) through (j) further comprise steps selected from the group consisting of controlling temperature and compensating effects due to temperature changes, during implementation of the method.

21. The method of claim 10, further comprising the steps of:

(k) sensing at least one engine characteristic selected from the group consisting of engine noise and engine vibration, by at least one engine characteristic sensor;

(l) measuring said at least one engine characteristic of the engine and comparing said at least one engine characteristic to at least one corresponding pre-determined threshold level of said engine characteristic for distinguishing between engine activation and engine non-activation, said engine non-activation including engine turn-off;

(m) performing at least one 'AND' logic operation on a first signal corresponding to said at least one engine characteristic and on a delayed second signal sent from said counter corresponding to the low cranking strength of the battery; and (n) upon completing a particular 'AND' logic operation, activating said alarm for providing an additional in-use warning signal of the low cranking strength of the battery following engine turn-off.

22. A method for in-use detecting low cranking strength of a combustion engine battery during engine starting, the engine starting featuring activation and initiation of cranking of the combustion engine crankshaft by energy supplied by the combustion engine battery, the method comprising the steps of:

(a) sensing time varying voltage of the battery by an integrator, from initiation of and during the engine starting;

(b) evaluating time varying difference between said time varying voltage of the battery and a constant reference DC voltage by said integrator, for forming a plurality of evaluated voltage differences, from said initiation of and during the engine starting;

(c) integrating said plurality of said evaluated voltage differences by said integrator, for forming an output signal of said integrator, during the engine starting;

(d) determining and responding to said output signal of said integrator by a detector, for forming an output signal of said detector, during the engine starting;

(e) determining and responding to said output signal of said detector by an alarm, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;

(f) sensing at least one engine characteristic selected from the group consisting of engine noise and engine vibration, by at least one engine characteristic sensor;

(g) measuring said at least one engine characteristic of the engine and comparing said at least one engine characteristic to at least one corresponding pre-determined threshold level of said engine characteristic for distinguishing between engine activation and engine non-activation, said engine non-activation including engine turn-off;

(h) performing at least one 'AND' logic operation on a first signal corresponding to said at least one engine characteristic and on a delayed second signal sent from said detector corresponding to the low cranking strength of the battery; and (i) upon completing a particular 'AND' logic operation, activating said alarm for providing an additional in-use warning signal of the low cranking strength of the battery following engine turn-off.

23. The method of claim 22, whereby said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

24. The method of claim 22, whereby said sensing of said time varying voltage of the battery by said integrator is effected in a mode selected from the group consisting of continuously with time and discontinuously with time.

25. The method of claim 22, whereby said constant reference DC voltage is set at a value corresponding to less than normal but sufficient cranking strength of the battery required for the activation and initiation of cranking of the combustion engine crankshaft from said initiation of and during the engine starting.

26. The method of claim 22, whereby step (d) further comprises the step of:

(i) determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

27. The method of claim 22, whereby said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

28. The method of claim 27, whereby said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

29. The method of claim 22, whereby the steps (a) through (e) further comprise steps selected from the group consisting of controlling temperature and compensating effects due to temperature changes, during implementation of the method.

30. A method for in-use detecting low cranking strength of a combustion engine battery during engine starting, the engine starting featuring activation and initiation of cranking of the combustion engine crankshaft by energy supplied by the combustion engine battery, the method comprising the steps of:

(a) sensing time varying voltage of the battery by an integrator, from initiation of and during the engine starting;

(b) evaluating time varying difference between said time varying voltage of the battery and a constant reference DC voltage by said integrator, for forming a plurality of evaluated voltage differences, from said initiation of and during the engine starting;

(c) integrating said plurality of said evaluated voltage differences by said integrator, for forming an output signal of said integrator, during the engine starting;

(d) determining and responding to said output signal of said integrator by a detector, for forming an output signal of said detector, during the engine starting;

(e) determining and responding to said output signal of said detector by a one shot, for forming an output signal of said one shot, during the engine starting;

(f) determining and responding to said output signal of said one shot by a counter, whereupon according to said output signal of said one shot said counter registers a count number of occurrences of the low cranking strength of the battery, for forming an output signal of said counter, during the engine starting;

(g) determining and responding to said output signal of said integrator by a reset signal detector, for forming an output signal of said reset signal detector, simultaneous to step (d) of said determining and said responding to said output signal of said integrator by said detector, during the engine starting;

(h) delaying forwarding of said output signal of said reset signal detector by a reset delay, during the engine starting;

(i) analyzing and responding to simultaneous reception of said output signal of said one shot and said output signal of said reset delay by a reset logic circuit, for forming an output signal of said reset logic circuit, whereupon according to said output signal of said reset logic circuit sent to said counter, response of a counter reset mechanism associated with said counter is selected from the group consisting of activating for resetting said count number of said counter and remaining inactive by not resetting said count number of said counter, during the engine starting; and (j) determining and responding to said output signal of said counter by an alarm, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

31. The method of claim 30, whereby said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

32. The method of claim 30, whereby said sensing of said time varying voltage of the battery by said integrator is effected in a mode selected from the group consisting of continuously with time and discontinuously with time.

33. The method of claim 30, whereby said constant reference DC voltage is set at a value corresponding to less than normal but sufficient cranking strength of the battery required for the activation and initiation of cranking of the combustion engine crankshaft from said initiation of and during the engine starting.

34. The method of claim 30, whereby step (d) further comprises the step of:
   (i) determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

35. The method of claim 30, whereby step (g) further comprises the step of:
   (i) determining a value of said output signal of said integrator selected from the group consisting of less than, and, equal to or greater than, a pre-determined value of said reset signal detector, said pre-determined value of said reset signal detector representing a normally large decrease in said voltage of the battery during the engine starting and corresponding to normal cranking strength of the battery during the engine starting.

36. The method of claim 30, whereby step (i) further comprises the steps of:
   (i) inverting a digital value of said output signal of said one shot, for forming an inverted digital value of said output signal of said one shot, by said reset logic circuit;
   (ii) performing an 'AND' logic operation on said inverted digital value of said output signal of said one shot and on a digital value of said output signal of said reset delay, by said reset logic circuit; and
   (iii) responding to a particular result of said 'AND' logic operation of step (ii) by said reset logic circuit sending a corresponding logic output signal to said counter.

37. The method of claim 30, whereby said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

38. The method of claim 37, whereby said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

39. The method of claim 30, whereby the steps (a) through (j) further comprise steps selected from the group consisting of controlling temperature and compensating effects due to temperature changes, during implementation of the method.

40. The method of claim 30, further comprising the steps of:
   (k) sensing at least one engine characteristic selected from the group consisting of engine noise and engine vibration, by at least one engine characteristic sensor;
   (l) measuring said at least one engine characteristic of the engine and comparing said at least one engine characteristic to at least one corresponding pre-determined threshold level of said engine characteristic for distinguishing between engine activation and engine non-activation, said engine non-activation including engine turn-off;
   (m) performing at least one 'AND' logic operation on a first signal corresponding to said at least one engine characteristic and on a delayed second signal sent from said counter corresponding to the low cranking strength of the battery; and
   (n) upon completing a particular 'AND' logic operation, activating said alarm for providing an additional in-use warning signal of the low cranking strength of the battery following engine turn-off.

41. A device for in-use detecting low cranking strength of a combustion engine battery during engine starting, the engine starting featuring activation and initiation of cranking of the combustion engine crankshaft by energy supplied by the combustion engine battery, the device comprising:
   (a) a constant reference DC voltage;
   (b) a comparator operatively connected to leads of the combustion engine battery and to said constant reference DC voltage, for sensing time varying voltage of the battery and for comparing said time varying voltage of the battery to said constant reference DC voltage, thereby forming a plurality of output signals of said comparator from initiation of and during the engine starting;
   (c) an integrator operatively connected to said comparator, for integrating said plurality of said output signals of said comparator, thereby forming an output signal of said integrator during the engine starting;
   (d) a detector operatively connected to said integrator, for determining and responding to said output signal of said integrator, thereby forming an output signal of said detector during the engine starting;
   (e) an alarm operatively connected to said detector, for determining and responding to said output signal of said detector, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;
   (f) at least one engine characteristic sensor selected from the group consisting of engine noise sensors and engine vibration sensors, operatively connected for sensing at least one engine characteristic selected from the group consisting of engine noise and engine vibration;

(g) at least one engine characteristic level tester selected from the group consisting of engine noise level testers and engine vibration level testers, operatively connected to said at least one engine characteristic sensor for measuring said at least one engine characteristic and for comparing said measurement to a corresponding pre-determined threshold level of said at least one engine characteristic, for distinguishing between engine activation and engine non-activation, where engine non-activation includes engine turn-off;

(h) a logic circuit operatively connected to said at least one engine characteristic level tester and to an alarm, for performing at least one 'AND' logic operation on a first signal received from said engine characteristic level tester and on a delayed second signal received from said detector, said logic circuit upon completing a particular 'AND' logic operation activates said alarm for providing an additional in-use warning signal of the low cranking strength of the battery following said engine turn-off; and (i) a delay mechanism operatively connected to said detector and to said logic circuit, for effecting delay of said delayed second signal sent from said detector to said logic circuit, following said engine turn-off.

42. The device of claim 41, wherein said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

43. The device of claim 41, wherein said sensing of said time varying voltage of the battery by said comparator is effected in a mode selected from the group consisting of continuously with time and discontinuously with time.

44. The device of claim 41, wherein said constant reference DC voltage is set at a value corresponding to less than normal but sufficient cranking strength of the battery required for the activation and initiation of cranking of the combustion engine crankshaft from said initiation of and during the engine starting.

45. The device of claim 41, wherein said output signals of said comparator are selected from the group consisting of digital and analog.

46. The device of claim 41, wherein said detector is further operative for determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

47. The device of claim 41, wherein said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

48. The device of claim 47, wherein said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

49. The device of claim 41, further comprising components selected from the group consisting of components for controlling temperature and components for compensating effects due to temperature changes, during operation of the device.

50. A device for in-use detecting low cranking strength of a combustion engine battery during engine starting, the engine starting featuring activation and initiation of cranking of the combustion engine crankshaft by energy supplied by the combustion engine battery, the device comprising:

(a) a constant reference DC voltage;

(b) a comparator operatively connected to leads of the combustion engine battery and to said constant reference DC voltage, for sensing time varying voltage of the battery and for comparing said time varying voltage of the battery to said constant reference DC voltage, thereby forming a plurality of output signals of said comparator from initiation of and during the engine starting;

(c) an integrator operatively connected to said comparator, for integrating said plurality of said output signals of said comparator, thereby forming an output signal of said integrator during the engine starting;

(d) a detector operatively connected to said integrator, for determining and responding to said output signal of said integrator, thereby forming an output signal of said detector during the engine starting;

(e) a one shot operatively connected to said detector, for determining and responding to said output signal of said detector, thereby forming an output signal of said one shot during the engine starting;

(f) a counter operatively connected to said one shot, for determining and responding to said output signal of said one shot, whereupon according to said output signal of said one shot said counter registers a count number of occurrences of the low cranking strength of the battery, thereby forming an output signal of said counter during the engine starting;

(g) an alarm operatively connected to said counter, for determining and responding to said output signal of said counter, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;

(h) a counter reset mechanism associated with said counter, for resetting said count number of said occurrences of the low cranking strength of the battery;

(i) a reset signal detector operatively connected to said integrator, for determining and responding to said output signal of said integrator, thereby forming an output signal of said reset signal detector during the engine starting;

(j) a reset delay operatively connected to said reset signal detector, for delaying forwarding of said output signal of said reset signal detector during the engine starting; and (k) a reset logic circuit operatively connected to said one shot, operatively connected to said reset delay, and operatively connected to said counter, for analyzing and responding to substantially simultaneous reception of said output signal of said one shot and said output signal of said reset delay, thereby forming an output signal of said reset logic circuit, whereupon according to said output signal of said reset logic circuit sent to said counter, response of said counter reset mechanism associated with said counter is selected from the group consisting of activating for resetting said count number of said counter and remaining inactive by not resetting said count number of said counter, during the engine starting.

51. The device of claim 50, wherein said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

52. The device of claim 50, wherein said sensing of said time varying voltage of the battery by said comparator is effected in a mode selected from the group consisting of continuously with time and discontinuously with time.

53. The device of claim 50, wherein said constant reference DC voltage is set at a value corresponding to less than normal but sufficient cranking strength of the battery required for the activation and initiation of cranking of the combustion engine crankshaft from said initiation of and during the engine starting.

54. The device of claim 50, wherein said output signals of said comparator are selected from the group consisting of digital and analog.

55. The device of claim 50, wherein said detector is further operative for determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

56. The device of claim 50, wherein said reset signal detector is further operative for determining a value of said output signal of said integrator selected from the group consisting of less than, and, equal to or greater than, a pre-determined value of said reset signal detector, said pre-determined value of said reset signal detector representing a normally large decrease in said voltage of the battery during the engine starting and corresponding to normal cranking strength of the battery during the engine starting.

57. The device of claim 50, wherein said reset logic circuit is further operative for inverting a digital value of said output signal of said one shot, thereby forming an inverted digital value of said output signal of said one shot, for performing an 'AND' logic operation on said inverted digital value of said output signal of said one shot and on a digital value of said output signal of said reset delay, and for responding to a particular result of said 'AND' logic operation by said reset logic circuit sending a corresponding logic output signal to said counter.

58. The device of claim 50, wherein said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

59. The device of claim 58, wherein said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

60. The device of claim 50, further comprising components selected from the group consisting of components for controlling temperature and components for compensating effects due to temperature changes, during operation of the device.

61. The device of claim 50, further comprising:
   (l) at least one engine characteristic sensor selected from the group consisting of engine noise sensors and engine vibration sensors, operatively connected for sensing at least one engine characteristic selected from the group consisting of engine noise and engine vibration;
   (m) at least one engine characteristic level tester selected from the group consisting of engine noise level testers and engine vibration level testers, operatively connected to said at least one engine characteristic sensor for measuring said at least one engine characteristic and for comparing said measurement to a corresponding pre-determined threshold level of said at least one engine characteristic, for distinguishing between engine activation and engine non-activation, where engine non-activation includes engine turn-off;
   (n) a logic circuit operatively connected to said at least one engine characteristic level tester and to an alarm, for performing at least one 'AND' logic operation on a first signal received from said engine characteristic level tester and on a delayed second signal received from said counter, said logic circuit upon completing a particular 'AND' logic operation activates said alarm for providing an additional in-use warning signal of the low cranking strength of the battery following said engine turn-off; and
   (o) a delay mechanism operatively connected to said counter and to said logic circuit, for effecting delay of said delayed second signal sent from said counter to said logic circuit, following said engine turn-off.

62. A device for in-use detecting low cranking strength of a combustion engine battery during engine starting, the engine starting featuring activation and initiation of cranking of the combustion engine crankshaft by energy supplied by the combustion engine battery, the device comprising:
   (a) a constant reference DC voltage;
   (b) an integrator operatively connected to leads of the combustion engine battery and to said constant reference DC voltage, for sensing time varying voltage of the battery, for evaluating time varying difference between said time varying voltage of the battery and said constant reference DC voltage, thereby forming a plurality of evaluated voltage differences from said initiation of and during the engine starting, and for integrating said plurality of said evaluated voltage differences, thereby forming an output signal of said integrator during the engine starting;
   (c) a detector operatively connected to said integrator, for determining and responding to said output signal of said integrator, thereby forming an output signal of said detector during the engine starting;

(d) an alarm operatively connected to said detector, for determining and responding to said output signal of said detector, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;

(e) at least one engine characteristic sensor selected from the group consisting of engine noise sensors and engine vibration sensors, operatively connected for sensing at least one engine characteristic selected from the group consisting of engine noise and engine vibration;

(f) at least one engine characteristic level tester selected from the group consisting of engine noise level testers and engine vibration level testers, operatively connected to said at least one engine characteristic sensor for measuring said at least one engine characteristic and for comparing said measurement to a corresponding pre-determined threshold level of said at least one engine characteristic, for distinguishing between engine activation and engine non-activation, where engine non-activation includes engine turn-off;

(g) a logic circuit operatively connected to said at least one engine characteristic level tester and to an alarm, for performing at least one 'AND' logic operation on a first signal received from said engine characteristic level tester and on a delayed second signal received from said detector, said logic circuit upon completing a particular 'AND' logic operation activates said alarm for providing an additional in-use warning signal of the low cranking strength of the battery following said engine turn-off; and (h) a delay mechanism operatively connected to said detector and to said logic circuit, for effecting delay of said delayed second signal sent from said detector to said logic circuit, following said engine turn-off.

63. The device of claim 62, wherein said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

64. The device of claim 62, wherein said sensing of said time varying voltage of the battery by said integrator is effected in a mode selected from the group consisting of continuously with time and discontinuously with time.

65. The device of claim 62, wherein said constant reference DC voltage is set at a value corresponding to less than normal but sufficient cranking strength of the battery required for the activation and initiation of cranking of the combustion engine crankshaft from said initiation of and during the engine starting.

66. The device of claim 65, wherein said detector is further operative for determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

67. The device of claim 62, wherein said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

68. The device of claim 67, wherein said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

69. The device of claim 62, further comprising components selected from the group consisting of components for controlling temperature and components for compensating effects due to temperature changes, during operation of the device.

70. A device for in-use detecting low cranking strength of a combustion engine battery during engine starting, the engine starting featuring activation and initiation of cranking of the combustion engine crankshaft by energy supplied by the combustion engine battery, the device comprising:

(a) a constant reference DC voltage;

(b) an integrator operatively connected to leads of the combustion engine battery and to said constant reference DC voltage, for sensing time varying voltage of the battery, for evaluating time varying difference between said time varying voltage of the battery and said constant reference DC voltage, thereby forming a plurality of evaluated voltage differences from said initiation of and during the engine starting, and for integrating said plurality of said evaluated voltage differences, thereby forming an output signal of said integrator during the engine starting;

(c) a detector operatively connected to said integrator, for determining and responding to said output signal of said integrator, thereby forming an output signal of said detector during the engine starting;

(d) a one shot operatively connected to said detector, for determining and responding to said output signal of said detector, thereby forming an output signal of said one shot during the engine starting;

(e) a counter operatively connected to said one shot, for determining and responding to said output signal of said one shot, whereupon according to said output signal of said one shot said counter registers a count number of occurrences of the low cranking strength of the battery, thereby forming an output signal of said counter during the engine starting;

(f) an alarm operatively connected to said counter, for determining and responding to said output signal of said counter, whereupon according to said determination by said alarm, said response by said alarm is selected from the group consisting of remaining inactive and activating for providing an in-use warning signal of the low cranking strength of the battery to an operator of the combustion engine, at a time selected from the group consisting of during the engine starting and following the engine starting prior to engine turn-off;

(g) a counter reset mechanism associated with said counter, for resetting said count number of said occurrences of the low cranking strength of the battery;

(h) a reset signal detector operatively connected to said integrator, for determining and responding to said output signal of said integrator, thereby forming an output signal of said reset signal detector during the engine starting;

(i) a reset delay operatively connected to said reset signal detector, for delaying forwarding of said output signal of said reset signal detector during the engine starting; and (j) a reset logic circuit operatively connected to said one shot, operatively connected to said reset delay, and operatively connected to said counter, for analyzing and responding to substantially simultaneous reception of said output signal of said one shot and said output signal of said reset delay, thereby forming an output signal of said reset logic circuit, whereupon according to said output signal of said reset logic circuit sent to said counter, response of said counter reset mechanism associated with said counter is selected from the group consisting of activating for resetting said count number of said counter and remaining inactive by not resetting said count number of said counter, during the engine starting.

71. The device of claim 70, wherein said time varying voltage of the battery includes voltage changes in the battery caused by electro-mechanical noise and vibrations associated with the engine starting, said electro-mechanical noise and vibrations are selected from the group consisting of random electro-mechanical noise and vibrations, and, periodic electro-mechanical noise and vibrations.

72. The device of claim 70, wherein said sensing of said time varying voltage of the battery by said integrator is effected in a mode selected from the group consisting of continuously with time and discontinuously with time.

73. The device of claim 70, wherein said constant reference DC voltage is set at a value corresponding to less than normal but sufficient cranking strength of the battery required for the activation and initiation of cranking of the combustion engine crankshaft from said initiation of and during the engine starting.

74. The device of claim 70, wherein said detector is further operative for determining a value of said output signal of said integrator selected from the group consisting of less than, and, equal to or greater than, a pre-determined value of said detector, said pre-determined value of said detector representing a larger than normal decrease in said voltage of the battery during the engine starting and corresponding to the low cranking strength of the battery during the engine starting.

75. The device of claim 70, wherein said reset signal detector is further operative for determining a value of said output signal of said integrator selected from the group consisting of less than, and, equal to or greater than, a pre-determined value of said reset signal detector, said pre-determined value of said reset signal detector representing a normally large decrease in said voltage of the battery during the engine starting and corresponding to normal cranking strength of the battery during the engine starting.

76. The device of claim 70, wherein said reset logic circuit is further operative for inverting a digital value of said output signal of said one shot, thereby forming an inverted digital value of said output signal of said one shot, for performing an 'AND' logic operation on said inverted digital value of said output signal of said one shot and on a digital value of said output signal of said reset delay, and for responding to a particular result of said 'AND' logic operation by said reset logic circuit sending a corresponding logic output signal to said counter.

77. The device of claim 70, wherein said in-use warning signal of the low cranking strength of the battery is selected from the group consisting of a once occurring warning signal and an automatically recurring warning signal, said warning signal is selected from the group consisting of an audible signal, a visual signal, and, an electromagnetic signal, generated from a location selected from the group consisting of internal to a vehicle or device powered by the combustion engine and external to a vehicle or device powered by the combustion engine.

78. The device of claim 77, wherein said warning signal is selected from the group consisting of an audible signal sounding inside said vehicle or device, a visual signal appearing on dashboard display of said vehicle or device, a visual signal appearing on a rear-view mirror of said vehicle or device, a visual signal appearing on front windshield of said vehicle or device, and, a wireless signal generated from said vehicle or device.

79. The device of claim 70, further comprising components selected from the group consisting of components for controlling temperature and components for compensating effects due to temperature changes, during operation of the device.

80. The device of claim 74, further comprising:

(k) at least one engine characteristic sensor selected from the group consisting of engine noise sensors and engine vibration sensors, operatively connected for sensing at least one engine characteristic selected from the group consisting of engine noise and engine vibration;

(l) at least one engine characteristic level tester selected from the group consisting of engine noise level testers and engine vibration level testers, operatively connected to said at least one engine characteristic sensor for measuring said at least one engine characteristic and for comparing said measurement to a corresponding pre-determined threshold level of said at least one engine characteristic, for distinguishing between engine activation and engine non-activation, where engine non-activation includes engine turn-off;

(m) a logic circuit operatively connected to said at least one engine characteristic level tester and to an alarm, for performing at least one 'AND' logic operation on a first signal received from said engine characteristic level tester and on a delayed second signal received from said counter, said logic circuit upon completing a particular 'AND' logic operation activates said alarm for providing an additional in-use warning signal of the low cranking strength of the battery following said engine turn-off; and (n) a delay mechanism operatively connected to said detector and to said logic circuit, for effecting delay of said delayed second signal sent from said detector to said logic circuit, following said engine turn-off.

* * * * *